(12) United States Patent
Grottenmueller et al.

(10) Patent No.: US 11,466,839 B2
(45) Date of Patent: Oct. 11, 2022

(54) WAVELENGTH CONVERTING COMPONENT

(71) Applicant: Merck Patent GmbH, Darmstadt (DE)

(72) Inventors: Ralf Grottenmueller, Wiesbaden (DE); Abraham Casas Garcia-Minguillan, Wiesbaden (DE); Fumio Kita, Wiesbaden (DE); Andreas Benker, Lautertal (DE); Ingo Koehler, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 102 days.

(21) Appl. No.: 16/627,405

(22) PCT Filed: Jun. 27, 2018

(86) PCT No.: PCT/EP2018/067173
§ 371 (c)(1),
(2) Date: Dec. 30, 2019

(87) PCT Pub. No.: WO2019/002328
PCT Pub. Date: Jan. 3, 2019

(65) Prior Publication Data
US 2020/0141561 A1    May 7, 2020

(30) Foreign Application Priority Data

Jun. 30, 2017 (EP) ..................... 17001120

(51) Int. Cl.
*F21V 9/30* (2018.01)
*H01L 33/50* (2010.01)
(Continued)

(52) U.S. Cl.
CPC ............ *F21V 9/30* (2018.02); *B29D 11/0074* (2013.01); *C08G 77/62* (2013.01); *C09K 11/02* (2013.01);
(Continued)

(58) Field of Classification Search
CPC ........... F21V 9/30; C08G 77/62; C09K 11/02; H01L 33/502; G03B 21/204
See application file for complete search history.

(56) References Cited

U.S. PATENT DOCUMENTS

| 9,567,487 B2 | 2/2017 | Cho et al. |
| 10,000,665 B2 | 6/2018 | Grottenmueller et al. |

(Continued)

FOREIGN PATENT DOCUMENTS

| WO | 2013/144777 A1 | 10/2013 |
| WO | 2015/007778 A1 | 1/2015 |

(Continued)

OTHER PUBLICATIONS

International Search Report dated Sep. 6, 2018 issued in corresponding PCT/EP2018/067173 application (3 pages).

*Primary Examiner* — Mathieu D Vargot
(74) *Attorney, Agent, or Firm* — Millen White Zelano & Branigan, PC; Brion P. Heaney

(57) ABSTRACT

The present invention relates to a manufacturing method for a wavelength converting component which is prepared from a dispersion containing a crosslinkable ceramizable polymer material having a silazane repeating unit and at least one wavelength converting material. There are further provided wavelength converting components which can be used for converting blue, violet and/or UV light into light with a (Continued)

longer wavelength. There is also provided a light source and a lighting unit comprising said wavelength converting components.

27 Claims, 8 Drawing Sheets

(51) Int. Cl.
    *B29D 11/00*     (2006.01)
    *C08G 77/62*     (2006.01)
    *C09K 11/02*     (2006.01)
    *F21S 41/176*     (2018.01)
    *F21S 43/14*     (2018.01)
    *F21S 43/16*     (2018.01)
    *F21S 41/141*     (2018.01)
    *G03B 21/20*     (2006.01)

(52) U.S. Cl.
    CPC ........... *H01L 33/502* (2013.01); *F21S 41/141* (2018.01); *F21S 41/176* (2018.01); *F21S 43/14* (2018.01); *F21S 43/16* (2018.01); *G03B 21/204* (2013.01)

(56) References Cited

U.S. PATENT DOCUMENTS

| | | |
|---|---|---|
| 2008/0303044 A1 | 12/2008 | Kohno et al. |
| 2012/0256223 A1* | 10/2012 | Washizu ............... H01L 33/501 |
| | | 257/98 |
| 2015/0183932 A1* | 7/2015 | Katayama ............. H05B 33/04 |
| | | 438/34 |
| 2015/0188006 A1 | 7/2015 | Williams et al. |
| 2015/0243855 A1 | 8/2015 | Wilm |
| 2016/0172552 A1 | 6/2016 | Grottenmueller et al. |
| 2016/0238203 A1 | 8/2016 | Lenef et al. |
| 2017/0233300 A1* | 8/2017 | Raj ....................... C04B 35/488 |
| | | 118/697 |
| 2018/0111338 A1* | 4/2018 | Xu .......................... B32B 9/007 |

FOREIGN PATENT DOCUMENTS

| | | |
|---|---|---|
| WO | 2015/128460 A1 | 9/2015 |
| WO | 2017041875 A1 | 3/2017 |

* cited by examiner

WAVELENGTH CONVERTING COMPONENT

TECHNICAL FIELD OF THE INVENTION

The present invention relates to a method for manufacturing wavelength converting components, wherein the wavelength converting components are prepared from a dispersion containing a crosslinkable ceramizable material and at least one wavelength converting material. The present invention further relates to wavelength converting components which are prepared by said manufacturing method. The wavelength converting components of the present invention can be used for converting blue, violet and/or UV light into light with a longer wavelength and they are therefore particularly suitable for use in light emitting devices (LEDs). There is further provided a light source and a lighting unit comprising said wavelength converting component. The wavelength converting component of the present invention shows improved characteristics in terms of barrier properties, colour point stability, low coefficient of thermal expansion (CTE), mechanical stability, thermal conductivity and is particularly suitable and compatible with any type of wavelength converting material. Beyond that, the wavelength converting component is synthetically easily accessible and can be prepared in any desired three-dimensional shape. The wavelength converting component is particularly characterized by a high heat resistance so that no thermal decomposition takes place and the colour point is substantially constant under standard operating conditions of high power LEDs, ultra-high power LEDs or laser LEDs. In addition, the wavelength converting component of the present invention can be produced with less effort in comparison to known components based on phosphor ceramics and phosphor-in-glass (PiG) applications. Finally, the wavelength converting component of the present invention shows good compatibility with any type of phosphor. In contrast, some phosphor species, such as e.g. silicate phosphors or nitride phosphors, dissolve when placed in a hot glass melt or decompose when forming a ceramic component at high temperatures.

BACKGROUND OF THE INVENTION

High power LEDs, ultra-high power LEDs and laser LEDs for automotive or image projectors usually generate high temperatures of >200° C. with peaks of >300° C. to which the wavelength converting material and the surrounding matrix are exposed. The LED package as well as the matrix, in which the wavelength converting material is embedded, need to perform stably when exposed to such intense heat and/or radiation (e.g. ultra-violet (UV) and/or visible (VIS) radiation) conditions. The matrix of the wavelength converting material is usually formed from binder materials used to attach the wavelength converting material particles to the LED chip (typically silicones, such as e.g. phenyl silicone, Dow Corning OE-6550) and cannot withstand such harsh conditions without decomposition.

Therefore, ceramic platelets which are prepared by sintering wavelength converting material particles in powder form or as single crystals under high pressure and temperature are used as wavelength converting components in light emitting devices with high heat and radiation exposure. Since such ceramic platelets do not contain any organic material, they have an excellent thermal stability. Nevertheless, they show the following disadvantages: (1) Firstly, ceramic platelets with wavelength converting material are difficult to produce. The synthesis requires high temperature (>1000° C.) and high pressure conditions. (2) Secondly, ceramic platelets can only be produced with certain types of wavelength converting material being able to withstand high sintering temperatures. Moreover, the particles of the wavelength converting material need to have a small size. (3) Finally, ceramic platelets are limited in their shape to plain geometries. More complex geometries with protrusions and recesses are very difficult to manufacture.

The suitable matrix material for embedding the wavelength converting material in a LED plays a major role for improving the LED's performance. So far, many matrix materials suffer from among others loss of transmittance during the lifetime of the LED.

Hence, there is a need in LED industry to find suitable matrix materials for embedding wavelength converting materials in LEDs. Such materials should meet the following requirements:

i. The material should have good barrier properties to protect the wavelength converting material and silver coated reflectors in LED packages from external influences which cause a shortening of lifetime, such as e.g. water and/or other reactive gaseous substances such as e.g. $H_2S$.

ii. The material should withstand high temperature and high-intensity radiation without degradation and deterioration in mechanical and/or optical properties. The material should have a low tendency towards cracking and there should be no discolouration or degradation at temperatures of up to 250° C. in air atmosphere.

iii. The material should have a low coefficient of thermal extension (CTE) so that it has low shrinkage and weight loss when heated. Moreover, the material should have a good thermal conductivity so that heat dissipation takes place quickly.

iv. The material should be easily synthetically accessible and it should be possible to prepare any desired three-dimensional shape therefrom.

v. Finally, the material should be suitable for and compatible with any type of wavelength converting material.

The above requirements provide a major challenge for new materials which are used to embed wavelength converting materials in a matrix. Various approaches have been made in the prior art. The choice of a suitable matrix material is highly driven by its aging stability against UV and high temperatures as well as its processability. In the following, advantages and remaining disadvantages of known materials are discussed.

Silicon-based materials are currently dominating the market because of their advantageous optical, mechanical and aging properties. Silicone reflectors improve brightness performance, show superior heat resistance and photo-thermal stability when compared with conventional materials. With silicone-based reflectors there is minor degradation of the LED light intensity and they reflect light with a high efficiency of more than 98%. Silicones as protective films on chips show high heat resistance and they can be compounded with phosphors to make a white LED. Silicones can be dispensed or molded easily. Main applications are general lighting products such as LEDs and backlighting products in liquid crystal displays (LCDs).

The disadvantage with silicones is that they are highly transmissive and gas permeable. At elevated temperatures, chemical contaminants such as volatile organic compounds (VOCs) outgassing from the circuit board can cause discolouration, specifically yellowing over time. VOCs can accelerate the degradation of LEDs or impair their performance.

The effect of chemical incompatibility was observed in blue and white LEDs, but not in red or green LEDs. Silicones are coloured yellow from light and heat. Silicones are also permeable for moisture which enhances degradation and reduces LED performance and lifetime. A further disadvantage of silicones is the high CTE (320 ppm/° C., Electronic Packaging and Interconnection Handbook). Also, the refractive index should be higher. The refractive index of a typical Gallium Nitride LED chip is about 2.4. The light leaving the LED chip into a material with a lower refractive index is limited by total internal reflection on the interface. Similarly, there is an index mismatch with the wavelength converting material embedded in the matrix material. A higher refractive index of the matrix material mitigates this effect and therefore increases the brightness of the LED. So far, phenyl silicones with a refractive index of up to 1.54 are used as high refractive index materials. The drawback of such materials is the presence of aromatic groups which limits their thermal and optical stability. Beyond that, the mixing of silicones with nanocrystals with high refractive index is difficult due to the incompatibility of silicones with most other materials leading to undesired aggregation of the nanocrystals.

Epoxides are known for their excellent adhesion, chemical and heat resistance, good-to-excellent mechanical properties, and very good electrical insulating properties. On the other hand, epoxides have poor aging characteristics. They show poor moisture resistance due to high water absorption and especially poor light resistance due to low transmittance for light with short wavelength.

The advantages of glass are superior optical properties and durability. That makes it more attractive for high end applications. However, the main disadvantage with glass is its incompatibility with standard LED manufacturing processes and with some Si-containing wavelength converting materials, such as e.g. silicate phosphors and nitride phosphors, which are dissolved in hot glass melts. Phosphor-in-glass (PiG) applications are known for example from WO 2013/144777 A1.

Ceramic matrix materials have been described as encapsulants for wavelength converting materials in LEDs in the prior art. Such ceramic materials are based on inorganic, non-metallic solid materials comprising metal, non-metal or metalloid atoms primarily held in ionic and covalent bonds. The crystallinity of ceramic materials ranges from highly oriented to semi-crystalline, and often completely amorphous (e.g. glasses). Varying crystallinity and electron consumption in the ionic and covalent bonds cause most ceramic materials to be good thermal an electrical insulators. Typical ceramics are inorganic, non-metallic, often crystalline oxide, nitride or carbide materials. Some elements, such as carbon or silicon, may be considered as ceramics. Ceramic materials are brittle, hard, strong in compression, weak in shearing and tension. They withstand chemical erosion that occurs in other materials subjected to acidic or caustic environments. Ceramics generally can withstand very high temperatures, such as temperatures that range from 1000 to 1600° C. Glass is often not considered a ceramic because of its amorphous (non-crystalline) character.

US 2015/0243855 A1 relates to a light-emitting semiconductor component, comprising a light-emitting semiconductor chip, a wavelength conversion element and a filter layer. The wavelength conversion element is arranged spatially at a distance from the filter layer and can comprise a transparent matrix material, wherein the wavelength conversion substance can be embedded into the matrix material or chemically bonded thereto. The transparent matrix material can comprise a transparent plastic, for instance silicones, epoxides, acrylates, imides, carbonates, olefins or derivatives thereof. Furthermore, the wavelength conversion element can comprise a light-transmissive carrier element, which comprises for instance glass or a transparent plastic in the form of a plate, a film, a cover sheet, a shell or a window and on which the wavelength conversion substance is applied. Furthermore, the wavelength conversion element can be embodied as a ceramic wavelength conversion element which is formed from one or a plurality of the wavelength conversion substances mentioned above or comprises one or a plurality thereof in a ceramic matrix material. A ceramic wavelength conversion element can be embodied in particular in a self-supporting fashion, for example as a ceramic lamina or ceramic plate, and have a planar or curved form in the form of a sheet or cover.

US 2008/0303044 A1 relates to a semiconductor LED containing a semiconductor light-emitting element capable of emitting light, a fluorescent substance capable of converting the wavelength of light, and a light-transmissive sealing material encapsulating the semiconductor light-emitting element, formed of an inorganic material having, at least partially, a silicon-nitrogen linkage and including a fluorescent substance. The inorganic material is formed of ceramics which can be manufactured by making use of a precursor having silicon-nitrogen linkage and wherein the silicon-nitrogen linkage of the precursor is partially left remained therein after the manufacture thereof. Specific examples of the inorganic material are light-transmissive ceramics or high-purity glass such as e.g. quartz glass, soda glass or crystal glass.

US 2016/0238203 A1 relates to a light source comprising a semiconductor device emitting a primary light, a thermally conductive optic having a reflective coating and a wavelength converter. The light source minimizes spot size expansion and total internal reflection trapping for laser-activated remote phosphor configurations, where high pump fluxes are required to attain high radiance of converted light from the phosphor. As an unintended consequence, a local heating of the phosphor occurs leading to a reduced quantum efficiency which results in severe limits on the final radiance of converted light. To address this problem, several approaches have been used. One solution is to use a wavelength converter in the form of a high thermal conductivity ceramic in combination with a high thermal conductivity substrate. Ceramic wavelength converters are formed by sintering a mass of inorganic phosphor particles at high temperature until the particles diffuse and stick together to form a monolithic piece. Ceramic wavelength converters have a thermal conductivity that is much greater than wavelength converters formed by dispersing individual phosphor particles in a silicone resin.

In conclusion, the materials used for embedding wavelength converting materials in LED applications from the prior art leave some room for improvement, in particular with respect to a simpler and more economic manufacturing process, a better compatibility with Si-containing phosphors, such as e.g. silicate phosphors or nitride phosphors, while maintaining a good heat resistance in order to avoid thermal decomposition and deterioration in mechanical and/or optical properties during operation.

OBJECT OF THE INVENTION

Various materials for embedding wavelength converting materials in LEDs have been proposed in the state of the art so far. However, there is a strong need to improve these materials as well as their production and processing conditions in order to obtain wavelength converting components for LEDs which can be prefabricated and then applied to the LED chip and which show improved features. Such wavelength converting components should have improved barrier properties, colour point stability, thermal expansion behavior, mechanical stability and thermal conductivity and should be particularly suitable and compatible for any type of wavelength converting material. Beyond that, there is a strong need for wavelength converting components which can be manufactured in a simple and economic way and which can be prepared in any desired three-dimensional shape. Until now, no wavelength converting components for LED applications have been reported which are easily accessible and show the above-mentioned beneficial effects under standard operating conditions of high power LEDs, ultra-high power LEDs or laser LEDs and which are compatible with various wavelength converting material species. The same holds true for corresponding manufacturing methods which enable the production of such wavelength converting components.

It is therefore an aim of the present invention to overcome the disadvantages in the prior art and to provide a method of manufacturing a wavelength converting component with at least one wavelength converting material which enables the production of LEDs showing the above-mentioned beneficial effects. In particular, it is an object of the present invention to provide a method of manufacturing wavelength converting components in a simple and efficient manner, wherein the wavelength converting components show an improved heat resistance and a broad compatibility towards various wavelength converting material species. Beyond that, it is an object of the present invention to provide a method of manufacturing wavelength converting components, wherein the wavelength converting components can be prepared in any desired three-dimensional shape.

Moreover, it is an object of the present invention to provide a wavelength converting component showing the above-mentioned advantages and to provide a light source and a lighting unit which contain said wavelength converting component with the above-mentioned beneficial effects.

The wavelength converting component of the present invention is particularly suitable for the conversion of blue, violet and/or UV light into light with a longer wavelength.

SUMMARY OF THE INVENTION

The present inventors have surprisingly found that the above objects can be solved by a manufacturing method for a wavelength converting component containing at least one wavelength converting material and a matrix material, wherein the method comprises the following steps:

(a) providing a dispersion containing a crosslinkable ceramizable material and at least one wavelength converting material, wherein the crosslinkable ceramizable material is a polymer containing a silazane repeating unit $M^1$; and (b) curing said dispersion at a temperature of >250 to ≤500° C., preferably at a temperature of >280 to ≤470° C., more preferably at a temperature of >300 to ≤450° C., still more preferably at a temperature of ≥305 to ≤425° C. and most preferably at a temperature of ≥310 to ≤400° C., to obtain a wavelength converting component.

Moreover, a wavelength converting component is provided which is obtainable or obtained by the manufacturing method according to the present invention.

There is further provided a wavelength converting component containing at least one wavelength converting material embedded in a matrix material, wherein the matrix material contains Si—N bonds and wherein the matrix material has a density of ≥1.16 g/cm$^3$, preferably of ≥1.21 g/cm$^3$, at 25° C.

Moreover, there is provided a wavelength converting component containing at least one wavelength converting material embedded in a matrix material, wherein the matrix material contains Si—N bonds and wherein the matrix material has a coefficient of thermal expansion of ≤150 ppm/K in a temperature range from 25 to 80° C.

The wavelength converting components of the present invention may be used for the conversion of blue, violet and/or UV light from a primary light source, preferably from a semiconductor light emitting diode (LED chip) or semiconductor laser diode (LD chip), into light with a longer wavelength.

In addition, a light source, comprising a wavelength converting component according to the present invention is provided.

There is further provided a lighting unit, in particular for projectors or automotive lighting, which comprises at least one of the inventive light sources.

Preferred embodiments of the present invention are described hereinafter and in the dependent claims.

DETAILED DESCRIPTION

Definitions

Figure 1:
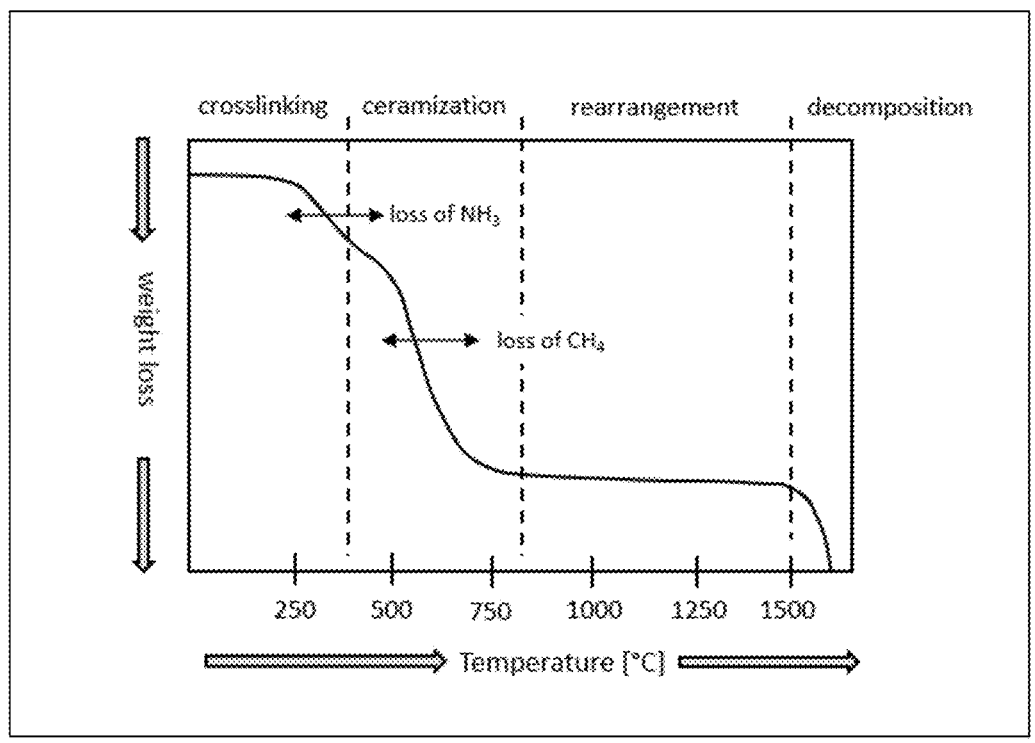
FIG. 1: Schematic course of the curing and ceramization process of organopolysilazanes. The weight loss is shown as a function of the temperature.

The term "crosslinking" as used herein refers to a crosslinking reaction which may be induced by any kind of energy such as e.g. heat and/or radiation, and/or a catalyst. A crosslinking reaction involves sites or groups on existing polymers or an interaction between existing polymers that results in the formation of a small region in a polymer from which at least three chains emanate. Said small region may be an atom, a group of atoms, or a number of branch points connected by bonds, groups of atoms or oligomeric or polymeric chains.

The term "ceramizing" as used herein describes the preparation of a ceramic material from a ceramic precursor. Ceramic materials are based on inorganic, non-metallic solid materials comprising metal, non-metal or metalloid atoms primarily held in ionic and covalent bonds.

The term "polymer" includes, but is not limited to, homopolymers, copolymers, for example, block, random, and alternating copolymers, terpolymers, quaterpolymers, etc., and blends and modifications thereof. Furthermore, unless otherwise specifically limited, the term "polymer" shall include all possible configurational isomers of the material. These configurations include, but are not limited to isotactic, syndiotactic, and atactic symmetries. A polymer is a molecule of high relative molecular mass, the structure of which essentially comprises the multiple repetition of units (i.e. repeating units) derived, actually or conceptually, from molecules of low relative mass (i.e. monomers).

The term "monomer" as used herein refers to a molecule which can undergo polymerization thereby contributing constitutional units (repeating units) to the essential structure of a polymer.

The term "homopolymer" as used herein stands for a polymer derived from one species of (real, implicit or hypothetical) monomer.

The term "copolymer" as used herein generally means any polymer derived from more than one species of monomer, wherein the polymer contains more than one species of corresponding repeating unit. In one embodiment the copolymer is the reaction product of two or more species of monomer and thus comprises two or more species of corresponding repeating unit. It is preferred that the copolymer comprises two, three, four, five or six species of repeating unit. Copolymers that are obtained by copolymerization of three monomer species can also be referred to as terpolymers. Copolymers that are obtained by copolymerization of four monomer species can also be referred to as quaterpolymers. Copolymers may be present as block, random, and/or alternating copolymers.

The term "block copolymer" as used herein stands for a copolymer, wherein adjacent blocks are constitutionally different, i.e. adjacent blocks comprise repeating units derived from different species of monomer or from the same species of monomer but with a different composition or sequence distribution of repeating units.

Further, the term "random copolymer" as used herein refers to a polymer formed of macromolecules in which the probability of finding a given repeating unit at any given site in the chain is independent of the nature of the adjacent repeating units. Usually, in a random copolymer, the sequence distribution of repeating units follows Bernoullian statistics.

The term "alternating copolymer" as used herein stands for a copolymer consisting of macromolecules comprising two species of repeating units in alternating sequence.

The term "polysilazane" as used herein refers to a polymer in which silicon and nitrogen atoms alternate to form the basic backbone. Since each silicon atom is bound to at least one nitrogen atom and each nitrogen atom to at least one silicon atom, both chains and rings of the general formula $[R^1R^2Si-NR^3]_m$ occur, wherein $R^1$ to $R^3$ are independently from each other hydrogen atoms or organic substituents; and m is an integer. If all substituents $R^1$ to $R^3$ are H atoms, the polymer is designated as perhydropolysilazane, polyperhydrosilazane or inorganic polysilazane ($[H_2Si-NH]_m$). If at least one substituent $R^1$ to $R^3$ is an organic substituent, the polymer is designated as organopolysilazane.

The term "polysiloxazane" as used herein refers to a polysilazane which additionally contains sections in which silicon and oxygen atoms alternate. Such section may be represented for example by $[O-SiR^4R^5]_n$, wherein $R^4$ and $R^5$ can be hydrogen atoms or organic substituents; and n is an integer. If all substituents of the polymer are H atoms, the polymer is designated as perhydropolysiloxazane. If at least one substituents of the polymer is an organic substituent, the polymer is designated as organopolysiloxazane.

Polymers having a silazane repeating unit $[R^1R^2Si-NR^3]_m$ as described above are typically referred to as polysilazanes or polysiloxazanes. While polysilazanes are composed of one or more different silazane repeating units, polysiloxazanes additionally contain one or more different siloxane repeating unit $[O-SiR^4R^5]_n$ as described above. The structure of polysilazanes or polysiloxazanes usually contains not only linear sections, but also separate or condensed rings and complex three-dimensional arrangements. Polysilazanes and polysiloxazanes contain tertiary nitrogen atoms "$Si_3N$" (with respect to silicon) and possibly primary nitrogen atoms "$SiNR_2$" and secondary nitrogen atoms "$Si_2NR$". Likewise, they contain tertiary silicon atoms "N₃SiR" (with respect to nitrogen) and possibly primary silicon atoms "NSiR₃" and secondary silicon atoms "N₂SiR₂". The exact structure may vary depending on the specific synthesis and the nature of the substituents R.

Polysilazanes and polysiloxazanes are usually liquid polymers which become solid at molecular weights of ca.>10,000 g/mol. In most applications liquid polymers of moderate molecular weights, typically in the range from 2,000 to 8,000 g/mol, are used. For preparing a solid coating from such liquid polymers, a crosslinking reaction is required.

Polysilazanes or polysiloxazanes are crosslinked by hydrolysis reactions, wherein moisture and optionally oxygen from the air reacts according to the mechanisms shown by Equations (I) and (II).

Hydrolysis or oxidation of Si—N and Si—H occurs, if water and optionally oxygen is present:

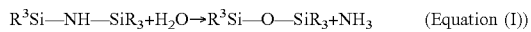

$$R^3Si-NH-SiR_3+H_2O \rightarrow R^3Si-O-SiR_3+NH_3 \quad \text{(Equation (I))}$$

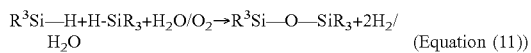

$$R^3Si-H+H-SiR_3+H_2O/O_2 \rightarrow R^3Si-O-SiR_3+2H_2/H_2O \quad \text{(Equation (11))}$$

Crosslinking may also occur by loss of hydrogen according to the mechanism shown by Equation (III).

Crosslinking by loss of hydrogen:

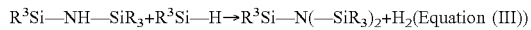

$$R^3Si-NH-SiR_3+R^3Si-H \rightarrow R^3Si-N(-SiR_3)_2+H_2 \quad \text{(Equation (III))}$$

During the above crosslinking reactions there is an increase in molecular weight and the material becomes solid. The crosslinking thus leads to a curing of the polysilazane or polysiloxazane material. For this reason, the terms "curing" and "crosslinking" and the corresponding verbs "cure" and "crosslink" are interchangeably used as synonyms in the present application when referred to silazane based polymers such as e.g. polysilazanes and polysiloxazanes.

Usually, crosslinking is performed by hydrolysis and starts at ambient conditions (20 to 25° C.) or at elevated temperatures of ≥150 to ≤250° C. To achieve complete crosslinking higher temperatures are required. The present inventors found by IR analysis that the Si—H and N—H bonds in silazane based polymers completely disappear when heating the material to temperatures of >250 to ≤500° C., preferably >280 to ≤500° C., more preferably >300 to ≤500° C., still more preferably ≥305 to ≤500° C. and most preferably ≥310 to ≤500° C. These temperature ranges are therefore used for the curing in step (b) of the manufacturing method according to the present invention.

In a preferred embodiment, the manufacturing method according to the present invention provides a two-stage curing process, wherein a precuring step (b-1) is conducted at a first temperature of ≥150 to ≤250° C., preferably ≥150 to ≤200° C., followed by a curing step (b-2) at a second temperature of >250 to ≤500° C., preferably >280 to ≤500° C., more preferably >300 to ≤500° C., still more preferably ≥305 to ≤500° C. and most preferably ≥310 to ≤500° C.

If crosslinked organopolysilazanes or organopolysiloxazanes, where at least one substituent R is a carbon-containing substituent, are further heated to temperatures of >500° C., carbon is released as methane or carbon dioxide depending on the atmosphere conditions and a silicon-nitride type or silicon-oxynitride type ceramic is formed.

However, it is preferred that such ceramization does not form part of the manufacturing method of the present invention. Thus, it is preferred that the manufacturing method does not contain any further heat treatment in addition to the curing in step (b). In a preferred embodiment, the manufacturing method does not contain a heat treatment step, where temperatures of >500° C. are applied.

The same applies mutatis mutandis to the manufacturing method when a two-stage curing process is applied, wherein a precuring step (b-1) is conducted, followed by a curing step (b-2) as described above. In this case, it is preferred that the manufacturing method does not contain any further heat treatment in addition to steps (b-1) and (b-2). In a preferred embodiment, the manufacturing method does not contain a heat treatment step, where temperatures of >500° C. are applied.

A crosslinkable and ceramizable material within the meaning of the present invention is a polymer containing at least one silazane repeating unit $M^1$ which undergoes at least the transformations shown by Equations (I) to (III) when heated up to temperatures of ≤500° C. The crosslinkable ceramizable material may be ceramized at temperatures of >500° C. which means that carbon is released as described above.

FIG. 1 provides a schematic view on the course of the curing and ceramization process of organopolysilazanes. The weight loss is shown as a function of the temperature.

Figure 4:
FIG. 4: Direct and remote arrangement of the wavelength converting component with respect to the primary light source (e.g. LED chip).

The term "LED" as used herein refers to light emitting devices comprising one or more of a light emitting source, lead frame, wiring, solder (flip chip), converter, filling material, encapsulation material, primary optics and/or secondary optics. Semiconductor light emitting sources may be selected from semiconductor light emitting diodes (LED chips) or semiconductor laser diodes (LD chips). The converter and encapsulation material may form a wavelength converting component which may additionally contain a filling material. An LED may be prepared from an LED precursor containing a semiconductor light source (LED chip) and/or lead frame and/or gold wire and/or solder (flip chip) on which a wavelength converting component is mounted. Such wavelength converting component may be either arranged directly on an LED chip or alternatively arranged remote therefrom, depending on the respective type of application (FIG. 4).

The term "high power LED" as used herein refers to an LED comprising an LED chip, which is operated at a current density of >350 mA per 1 mm² to ≤1000 mA per 1 mm² chip area.

The term "ultra-high power LED" as used herein refers to an LED comprising an LED chip, which is operated at current density of >1000 mA per 1 mm² chip area.

The term "laser LED" as used herein refers to an LED comprising an LD chip.

The term "wavelength converting material" or briefly referred to as a "converter" means a material that converts light of a first wavelength to light of a second wavelength, wherein the second wavelength is different from the first wavelength. Wavelength converting materials are phosphors and semiconductor nanoparticles.

A "phosphor" is a fluorescent inorganic material which contains one or more light emitting centers. The light emitting centers are formed by activator elements such as e.g. atoms or ions of rare earth metal elements, for example La, Ce, Pr, Nd, Pm, Sm, Eu, Gd, Tb, Dy, Ho, Er, Tm, Yb and Lu, and/or atoms or ions of transition metal elements, for example Cr, Mn, Fe, Co, Ni, Cu, Ag, Au and Zn, and/or atoms or ions of main group metal elements, for example Na, Tl, Sn, Pb, Sb and Bi. Examples of suitable phosphors include phosphors based on garnet, silicate, orthosilicate, thiogallate, sulfide, nitride, silicon-based oxynitride, nitridosilicate, nitridoaluminumsilicate, oxonitridosilicate, oxonitridoaluminumsilicate and rare earth doped sialon.

Phosphors within the meaning of the present application are materials which absorb electromagnetic radiation of a specific wavelength range, preferably blue and/or ultraviolet (UV) electromagnetic radiation, and convert the absorbed electromagnetic radiation into electromagnetic radiation having a different wavelength range, preferably visible (VIS) light such as violet, blue, green, yellow, orange or red light.

The term "semiconductor nanoparticle" in the present application denotes a crystalline nanoparticle which consists of a semiconductor material. Semiconductor nanoparticles are also referred to as quantum materials in the present application. They represent a class of nanomaterials with physical properties that are widely tunable by controlling particle size, composition and shape. Among the most evident size dependent property of this class of materials is the tunable fluorescence emission. The tunability is afforded by the quantum confinement effect, where reducing particle size leads to a "particle in a box" behavior, resulting in a blue shift of the band gap energy and hence the light emission. For example, in this manner, the emission of CdSe nanocrystals can be tuned from 660 nm for particles of diameter of ~6.5 nm, to 500 nm for particles of diameter of ~2 nm. Similar behavior can be achieved for other semiconductors when prepared as nanocrystals allowing for broad spectral coverage from the UV (using ZnSe, CdS for example) throughout the visible (using CdSe, InP for example) to the near-IR (using InAs for example).

Suitable semiconductor materials are selected from groups II-VI, III-V, IV-VI or I-III-VI$_2$ or any desired combination of one or more thereof. For example, the semiconductor material may be CdS, CdSe, CdTe, ZnS, ZnSe, ZnTe, ZnO, GaAs, GaP, GaAs, GaSb, GaN, HgS, HgSe, HgTe, InAs, InP, InSb, AlAs, AlP, AlSb, Cu$_2$S, Cu$_2$Se, CuGaS$_2$, CuGaSe$_2$, CuInS$_2$, CuInSe$_2$, Cu$_2$(InGa)S$_4$, AgInS$_2$, AgInSe$_2$, Cu$_2$(ZnSn)S$_4$, alloys thereof and mixtures thereof.

Semiconductor nanoparticles are any desired discrete units having at least one dimension in the sub-micron size, which, in some embodiments, is less than 100 nm and in some other embodiments has a size of less than one micron as the largest dimension (length). In some other embodiments, the dimension is less than 400 nm. The semiconductor nanoparticle can have any desired symmetrical or asymmetrical geometrical shape, and non-restrictive examples of possible shapes are elongate, round, elliptical, pyramidal, etc. A specific example of a semiconductor nanoparticle is an elongate nanoparticle, which is also called a nanorod and is made from a semiconducting material. Further semiconductor nanorods which can be used are those having a metal or metal-alloy region on one or both ends of the respective nanorod. Examples of such elongate semiconductor/metal nanoparticles and the production thereof are described in WO 2005/075339, the disclosure content of which is incorporated herein by way of reference. Other possible semiconductor/metal nanoparticles are shown in WO 2006/134599, the disclosure content of which is incorporated herein by way of reference.

Furthermore, semiconductor nanoparticles in a core/shell configuration or a core/multishell configuration are known. These are discrete semiconductor nanoparticles which are characterized by a heterostructure, in which a "core" comprising one type of material is covered with a "shell" comprising another material. In some cases, the shell is allowed to grow on the core, which serves as "seed core". The core/shell nanoparticles are then also referred to as "seeded" nanoparticles. The expression "seed core" or "core" relates to the innermost semiconductor material present in the hetero-structure. Known semiconductor nanoparticles in core/shell configuration are shown, for example, in EP 2 528 989 B1, the contents of which are incorporated into the present description in their totality by way of reference.

The semiconductor nanoparticles may be also employed as semiconductor nanoparticles on the surface of non-activated crystalline materials. In such converters, one or more types of semiconductor nanoparticles (quantum materials) are located on the surface of one or more types of non-activated crystalline materials.

As used herein, the term "non-activated crystalline material" denotes an inorganic material in particle form which is crystalline and does not have an activator, i.e. light converting centers. The non-activated crystalline material is thus itself neither luminescent nor fluorescent. In addition, it has no specific inherent absorption in the visible region and is consequently colourless. Furthermore, the non-activated crystalline material is transparent. The non-activated crystalline material serves as support material for the semiconductor nanoparticles. Owing to the lack of colour and the transparency of the non-activated crystalline material, light emitted by a primary light source or by another wavelength converting material is able to pass through the material unhindered and with no losses.

Preferred non-activated crystalline materials are matrix materials of an inorganic phosphor selected from non-activated crystalline metal oxides, non-activated crystalline silicates and halosilicates, non-activated crystalline phosphates and halophosphates, non-activated crystalline borates and borosilicates, non-activated crystalline aluminates, gallates and alumosilicates, non-activated crystalline molybdates and tungstates, non-activated crystalline sulfates, sulfides, selenides and tellurides, non-activated crystalline nitrides and oxynitrides, non-activated crystalline SiAlONs and other non-activated crystalline materials, such as non-activated crystalline complex metal-oxygen compounds, non-activated crystalline halogen compounds and non-activated crystalline oxy compounds, such as preferably oxysulfides or oxychlorides.

Suitable semiconductor nanoparticles on non-activated crystalline materials are described in WO 2017/041875 A1 the disclosure of which is hereby incorporated by reference.

The term "encapsulation material" or "encapsulant" as used herein means a material which covers or encloses a wavelength converting material. The encapsulation material may be regarded as a matrix embedding the converter particles. Preferably, the encapsulation material forms part of a wavelength converting component (or briefly converter component) which contains one or more wavelength converting materials and optionally one or more filling materials. The encapsulation material forms a barrier against the external environment of the LED, thereby protecting the converter and/or the LED chip. External environmental influences against which the encapsulation material needs to protect the LED may be chemical such as moisture, acids, bases, oxygen, etc. or physical such as temperature, mechanical impact, or stress. The encapsulation material usually acts as a binder for the converter. The encapsulating material is preferably in direct contact with the converter and/or the LED chip. Usually, the encapsulation material forms part of an LED package comprising an LED chip and/or lead frame and/or gold wire, and/or solder (flip chip), the filling material, converter and a primary and secondary optic. The encapsulation material may fully or partially cover an LED chip and/or lead frame and/or gold wire.

The term "wavelength converting component" as used herein means a component for a light emitting device, such as e.g. a high power LED, an ultra-high power LED or a laser LED, comprising at least one wavelength converting material and an encapsulation material as matrix material embedding the wavelength converting material. The wavelength converting component may optionally contain one or more filler materials. The wavelength converting component may be formed as a three-dimensional molding having a complex surface shape with recesses, cavities, projections, etc. which cannot be made by grinding of (single) crystals or which can be made with sintered ceramics only to a certain extent while being rather expensive. Furthermore, different shapes allow specific beamforming effects such as e.g. lens effect, scattering effect, lightguide effect and/or uniform spatial distribution of light colour temperature which cannot be realized with ceramics for cost reasons. The wavelength converting component may be either arranged directly on a semiconductor light source (LED chip) or alternatively arranged remote therefrom, depending on the respective type of application (FIG. 4).

The term "Lewis acid" as used herein means a molecular entity (and the corresponding chemical species) that is an electron-pair acceptor and therefore able to react with a Lewis base to form a Lewis adduct, by sharing the electron pair furnished by the Lewis base. A "Lewis base" as used herein is a molecular entity (and the corresponding chemical species) that is able to provide a pair of electrons and thus capable of coordination to a Lewis acid, thereby forming a Lewis adduct. A "Lewis adduct" is an adduct formed between a Lewis acid and a Lewis base.

PREFERRED EMBODIMENTS

Method of Manufacturing

The present invention relates to a method of manufacturing a wavelength converting component containing at least one wavelength converting material and a matrix material, wherein the method comprises the following steps:

(a) providing a dispersion containing a crosslinkable ceramizable material and at least one wavelength converting material, wherein the crosslinkable ceramizable material is a polymer containing a silazane repeating unit $M^1$; and (b) curing said dispersion at a temperature of >250 to ≤500° C., preferably at a temperature of >280 to ≤470° C., more preferably at a temperature of >300 to ≤450° C., still more preferably at a temperature of ≥305 to ≤425° C. and most preferably at a temperature of ≥310 to ≤400° C., to obtain a wavelength converting component.

In a preferred embodiment the curing in step (b) is carried out for a time period of >0 to ≤24 h, preferably for a time period of ≥1 min to ≤24 h, more preferably for a time period of ≥1 h to ≤24 h and most preferably for a time period of ≥2 h to ≤24 h.

It is preferred that the curing in step (b) is carried out on a hot plate, in a furnace or by IR radiation.

In a preferred embodiment, the manufacturing method according to the present invention provides a two-stage curing process, wherein a precuring step (b-1) is conducted at a first temperature of ≥150 to ≤250° C., preferably at a temperature of ≥150 to ≤200° C., followed by a curing step (b-2) at a second temperature of ≥250 to ≤500° C., preferably at a temperature of >280 to ≤470° C., more preferably at a temperature of >300 to ≤450° C., still more preferably ≥305 to ≤425° C. and most preferably at a temperature of ≥310 to ≤400° C. It is preferred that the curing step is directly following the precuring step.

In a preferred embodiment the manufacturing method of the present invention does not contain any further heat treatment apart from the curing step (b) or the precuring step (b-1) and the curing step (b-2), respectively. Hence, no further crosslinking and/or ceramization takes place in this preferred embodiment. It is particularly preferred that the manufacturing method does not contain a heat treatment step, where temperatures of >500° C. are applied.

In a preferred embodiment the precuring in step (b-1) is carried out for a time period of >0 to ≤10 h, preferably for a time period of ≥1 min to ≤10 h, more preferably for a time period of ≥1 h to ≤10 h and most preferably for a time period of ≥2 h to ≤10 h. In a preferred embodiment the curing in step (b-2) is carried out for a time period of >0 to ≤24 h, preferably for a time period of ≥1 min to ≤24 h, more preferably for a time period of ≥1 h to ≤24 h and most preferably for a time period of ≥2 h to ≤24 h.

It is preferred that the precuring step (b-1) is followed directly by the curing step (b-2). Directly shall mean in this context that the curing step (b-2) follows immediately the precuring step (b-1) and that there is no further step in-between where a substantial change of the chemical composition and/or physical properties of the precured dispersion takes place.

It is preferred that the precuring in step (b-1) is carried out on a hot plate, in a furnace or by IR radiation.

It is preferred that the curing in step (b-2) is carried out on a hot plate, in a furnace or by IR radiation.

The material which is obtained after the curing in step (b) or step (b-1), i.e. the wavelength converting component, contains the at least one wavelength converting material embedded in a matrix material. The matrix material is formed by curing the crosslinkable polymer material containing a silazane repeating unit $M^1$. The matrix material embedding the at least one wavelength converting material contains Si—N bonds and is also referred to as "semi-ceramic material" in the present invention.

The present inventors found that fully cured silazane based polymers form a semi-ceramic material which is useful as an easy to synthesize substitute for conventional wavelength converting ceramics offering much more flexibility in the choice of type and mixture of wavelength converting material, in the colour point and in the geometric shape of the component. The semi-ceramic material is synthesized at temperatures of equal or more than 250° C. and less than 500° C. Therefore, the synthesis temperature is higher or at least as high as the temperature to which the material is exposed to in a high power LED, ultra-high power LED or laser LED. All chemical transformations for curing are finished and practically no change takes place anymore during the operational lifetime of the LED which imparts an excellent colour point stability.

Preferably, the polymer, which is used as crosslinkable ceramizable material, contains a repeating unit $M^1$ and a further repeating unit $M^2$, wherein $M^1$ and $M^2$ are silazane units which are different from each other. Preferably, the polymer contains a repeating unit $M^1$ and a further repeating unit $M^3$, wherein $M^1$ is a silazane unit and $M^3$ is a siloxazane unit. More preferably, the polymer contains a repeating unit $M^1$, a further repeating unit $M^2$ and a further repeating unit $M^3$, wherein $M^1$ and $M^2$ are silazane units which are different from each other and $M^3$ is a siloxazane unit.

In a preferred embodiment the polymer, which is used as crosslinkable ceramizable material, is a polysilazane. Preferably, the polysilazane contains a repeating unit $M^1$ and optionally a further repeating unit $M^2$, wherein $M^1$ and $M^2$ are silazane repeating units which are different from each other. It is preferred that at least one of $M^1$ and $M^2$ is an organosilazane unit so that the crosslinkable ceramizable material is an organopolysilazane.

In an alternative preferred embodiment the polymer, which is used as crosslinkable ceramizable material, is a polysiloxazane. Preferably, the polysiloxazane contains a repeating unit $M^1$ and a further repeating unit $M^3$, wherein $M^1$ is a silazane unit and $M^3$ is a siloxazane unit. More preferably, the polysiloxazane contains a repeating unit $M^1$, a further repeating unit $M^2$ and a further repeating unit $M^3$, wherein $M^1$ and $M^2$ are silazane units which are different from each other and $M^3$ is a siloxazane unit. It is preferred that at least one of $M^1$ and $M^2$ is an organosilazane unit so that the crosslinkable ceramizable material is an organopolysiloxazane.

In a particularly preferred embodiment the polymer, which is used as crosslinkable ceramizable material, is a mixture of a polysilazane and a polysiloxazane as defined above. In a most preferred embodiment the polymer is a mixture of an organopolysilazane and organopolysiloxazane.

It is preferred that the crosslinkable ceramizable material undergoes ceramization after having been cross-linked when the temperature is further increased to >500° C.

As noted above, the crosslinkable ceramizable material is a polymer containing a silazane repeating unit $M^1$. Preferably, the silazane repeating unit $M^1$ is represented by formula (I):

-[—SiR$^1$R$^2$—NR$^3$—]-  (I)

wherein $R^1$, $R^2$ and $R^3$ are independently from each other hydrogen or alkyl.

It is preferred that $R^1$, $R^2$ and $R^3$ in formula (I) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms. More preferably, $R^1$, $R^2$ and $R^3$ are independently from each other selected from the group consisting of hydrogen, straight-chain alkyl having 1 to 6 carbon atoms, branched-chain alkyl having 3 to 6 alkyl atoms and cycloalkyl having 3 to 6 carbon atoms. Most preferably, $R^1$, $R^2$ and $R^3$ are independently from each other hydrogen, methyl, ethyl, propyl, butyl, pentyl or hexyl.

In a preferred embodiment, the polymer contains besides the silazane repeating unit $M^1$ a further repeating unit $M^2$ which is represented by formula (II):

-[—SiR$^4$R$^5$—NR$^6$—]-  (II)

wherein $R^4$, $R^5$ and $R^6$ are independently from each other hydrogen or alkyl; and wherein $M^2$ is different from $M^1$.

It is preferred that $R^4$, $R^5$ and $R^6$ in formula (II) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms. More preferably, $R^4$, $R^5$ and $R^6$ are independently from each other selected from the group consisting of hydrogen, straight-chain alkyl having 1 to 6 carbon atoms, branched-chain alkyl having 3 to 6 carbon atoms and cycloalkyl having 3 to 6 carbon atoms. Most preferably, $R^4$, $R^5$ and $R^6$ are independently from each other hydrogen, methyl, ethyl, propyl, butyl, pentyl or hexyl.

In a further preferred embodiment, the polymer is a polysiloxazane which contains besides the silazane repeating unit $M^1$ a further repeating unit $M^3$ which is represented by formula (III):

-[—SiR$^7$R$^8$—[O—SiR$^7$R$^8$—]$_a$—NR$^9$—]-  (III)

wherein $R^7$, $R^8$, $R^9$ are independently from each other hydrogen or organyl; and a is an integer from 1 to 60, preferably from 1 to 50. More preferably, a may be an integer from 5 to 50 (long chain monomer $M^3$); or a may be an integer from 1 to 4 (short chain monomer $M^3$).

It is preferred that $R^7$, $R^8$ and $R^9$ in formula (III) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms. More preferably, $R^7$, $R^8$ and $R^9$ are independently from each other selected from the group consisting of hydrogen, straight-chain alkyl having 1 to 6 carbon atoms, branched-chain alkyl having 3 to 6 carbon atoms and cycloalkyl having 3 to 6 carbon atoms. Most preferably, $R^7$, $R^8$ and $R^9$ are independently from each other hydrogen, methyl, ethyl, propyl, butyl, pentyl or hexyl.

With respect to $R^1$, $R^2$, $R^3$, $R^4$, $R^5$, $R^6$, $R^7$, $R^8$ and $R^9$ the straight-chain alkyl groups, branched-chain alkyl groups and cycloalkyl groups may be substituted with one or more substituents $R_S$ which may be the same or different from each other, wherein $R_S$ is selected from F, Cl and SiMe$_3$.

With respect to $R^1$, $R^2$, $R^3$, $R^4$, $R^5$, $R^6$, $R^7$, $R^8$ and $R^9$ it is more preferred that the straight-chain alkyl groups, branched-chain alkyl groups and cycloalkyl groups are not substituted.

With respect to $R^1$, $R^2$, $R^3$, $R^4$, $R^5$, $R^6$, $R^7$, $R^8$ and $R^9$ it is preferred that the they are independently selected from hydrogen, straight-chain alkyl and branched-chain alkyl.

With respect to $R^1$, $R^2$, $R^3$, $R^4$, $R^5$, $R^6$, $R^7$, $R^8$ and $R^9$ it is more preferred that they are independently selected from hydrogen and straight-chain alkyl.

With respect to $R^1$, $R^2$, $R^3$, $R^4$, $R^5$, $R^6$, $R^7$, $R^8$ and $R^9$ preferred straight-chain alkyl groups are methyl, ethyl, n-propyl, n-butyl, n-pentyl and n-hexyl.

With respect to $R^1$, $R^2$, $R^3$, $R^4$, $R^5$, $R^6$, $R^7$, $R^8$ and $R^9$ preferred branched-chain alkyl groups may be selected from iso-propyl (1-methylethyl), sec-butyl (1-methylpropyl), iso-butyl (2-methylpropyl), tert-butyl (1,1-dimethylethyl), sec-pentyl (pentan-2-yl), 3-pentyl (pentan-3-yl), iso-pentyl (3-methyl-butyl), neo-pentyl (2,2-dimethyl-propyl) and tert-pentyl (2-methylbutan-2-yl), more preferably from iso-propyl (1-methylethyl), sec-butyl (1-methylpropyl), iso-butyl (2-methylpropyl) and tert-butyl (1,1-dimethylethyl).

With respect to $R^1$, $R^2$, $R^3$, $R^4$, $R^5$, $R^6$, $R^7$, $R^8$ and $R^9$ preferred cycloalkyl groups may be selected from cyclopropyl, cyclobutyl, cyclopentyl and cyclohexyl.

It is understood that the skilled person can freely combine the above-mentioned preferred, more preferred and most preferred embodiments relating to the substituents $R^1$, $R^2$, $R^3$, $R^4$, $R^5$, $R^6$, $R^7$, $R^8$ and $R^9$ in the polymer in any desired way.

Preferably, the polymer used as crosslinkable ceramizable material is a copolymer such as a random copolymer or a block copolymer or a copolymer containing at least one random sequence section and at least one block sequence section. More preferably, the polymer is a random copolymer or a block copolymer.

It is preferred that the polymer used as crosslinkable ceramizable material is an organopolysilazane, wherein at least one of the substituents $R^1$, $R^2$ and $R^3$ is a straight-chain alkyl group, a branched-chain alkyl group or a cycloalkyl group.

It is preferred that the polymer used as crosslinkable ceramizable material is an organopolysiloxazane, wherein at least one of the substituents $R^1$, $R^2$ and $R^3$ is a straight-chain alkyl group, a branched-chain alkyl group or a cycloalkyl group.

Preferably, the polymers used in the present invention as crosslinkable ceramizable material have a molecular weight $M_w$, as determined by GPC, of at least 1,000 g/mol, more preferably of at least 2,000 g/mol, even more preferably of at least 3,000 g/mol. Preferably, the molecular weight $M_w$ of the polymers is less than 100,000 g/mol. More preferably, the molecular weight $M_w$ of the polymers is in the range from 3,000 to 50,000 g/mol.

Preferably, the total content of the polymer in the dispersion is in the range from 1 to 99.5% by weight, preferably from 5 to 99% by weight.

In a preferred embodiment, the dispersion contains one or more solvents. Suitable solvents for the dispersion are, in particular, organic solvents which contain no water and also no reactive groups such as hydroxyl groups. These solvents are, for example, aliphatic or aromatic hydrocarbons, halogenated hydrocarbons, esters such as ethyl acetate or butyl acetate, ketones such as acetone or methyl ethyl ketone, ethers such as tetrahydrofuran or dibutyl ether, and also mono- and polyalkylene glycol dialkyl ethers (glymes), or mixtures of these solvents.

The dispersion is liquid and can be poured into molds to make parts of various geometries. Alternatively it can be coated directly onto the LED wafer (wafer level coating). The conversion to a semi-ceramic material needs much milder conditions of temperature not more than 500° C. and no pressure.

In a preferred embodiment, the dispersion contains a curing catalyst. The curing catalyst is able to accelerate the crosslinking reactions according to Equations (I) to (III). Suitable curing catalysts are Lewis acids as described in the unpublished EP patent application No. 16201984.8.

In a particularly preferred embodiment the Lewis acid curing catalyst in the dispersion is selected from the group consisting of triarylboron compounds such as e.g. $B(C_6H_5)_3$ and $B(C_6F_5)_3$, triarylaluminum compounds such as e.g. $Al(C_6H_5)_3$ and $Al(C_6F_5)_3$, palladium acetate, palladium acetylacetonate, palladium propionate, nickel acetylacetonate, silver acetylacetonate, platinum acetylacetonate, ruthenium acetylacetonate, ruthenium carbonyls, copper acetylacetonate, aluminum acetylacetonate, and aluminum tris (ethyl acetoacetate).

Depending on the catalyst system used, the presence of moisture or oxygen may play a role in the curing of the crosslinkable ceramizable material. For instance, through the choice of a suitable catalyst system, it is possible to achieve rapid curing at high or low atmospheric humidity or at high or low oxygen content. The skilled worker is familiar with these influences and will adjust the atmospheric conditions appropriately by means of suitable optimization methods.

Preferably, the amount of the Lewis acid curing catalyst in the dispersion is ≤10 weight-%, more preferably ≤5.0 weight-%, and most preferably ≤1.00 weight-%. Preferred ranges for the amount of the curing catalyst in the dispersion are from 0.001 to 10 weight-%, more preferably from 0.001 to 5.0 weight-%, and most preferably from 0.001 to 1.00 weight-%.

Preferably, the formulation may comprise one or more additives selected from the group consisting of fillers, nanoparticles, viscosity modifiers, surfactants, additives influencing film formation, additives influencing evaporation behavior and cross-linkers.

Preferred fillers are glass particles which preferably have a particle diameter of <10 μm. Such fillers may further improve the mechanical stability of the wavelength converting component. Preferred nanoparticles are selected from nitrides, titanates, diamond, oxides, sulfides, sulfites, sulfates, silicates and carbides which may be optionally surface-modified with a capping agent. Preferably, nanoparticles are materials having a particle diameter of <100 nm, more preferably <80 nm, even more preferably <60 nm, even more preferably <40 nm, and most more preferably <20 nm. The particle diameter may be determined by any standard method known to the skilled person.

If the refractive index of the wavelength converting component is to be further increased, it is preferred to add selected nanoparticles having a refractive index of >2.0. Such selected nanoparticles are for example $TiO_2$ and $ZrO_2$. The refractive index may be determined by any standard method known to the skilled person.

Since LED packages have a limited temperature stability and should not be exposed to temperature of >200° C., it is preferred that the curing of the dispersion in step (b) takes place on a support separately from the LED package. The wavelength converting component may then be detached from the support and afterwards attached to the LED chip or LD chip. This can be done, for example by small amounts of 90% PHPS in di-n-butylether which are dropped on top of the LED chip or LD chip. The wavelength converting component, which may be present in form of a platelet, is then positioned on the PHPS-wet chip and the LED package is then heated to temperatures of 100 to 200° C. for 1 to 8 h to cure the PHPS layer.

The support on which the curing preferably takes place is a base which carries the dispersion provided in step (a). In a preferred embodiment of the present invention the support is selected from the list consisting of a sheet, a foil, a plate and a mold. In a particularly preferred embodiment the support is a mold. Preferred materials of which the sheet, foil, plate and mold are made of are glass, ceramics, plastics and metal. A preferred plastics is a fluoropolymer such as e.g. polytetrafluorethylene (PTFE) or polyvinylidene fluoride (PVDF). A preferred metal is aluminum, more preferably aluminum with a fluoropolymer coating. PTFE or PVDF is particularly useful, if the wavelength converting component is to be detached from the support.

If the mechanical stability of the wavelength converting component is to be further increased, it is possible to cure the dispersion on a transparent substrate, for example a thin glass plate, or to attach the wavelength converting component after curing on such a transparent substrate. Thin glass plates have a thickness in the range of 10 μm to 300 μm.

The dispersion may be applied to the support by any known application method such as, for example, casting, dispensing, screen printing, stencil printing, spray coating, spin coating, slot coating and ink-jet printing.

In a preferred embodiment of the present invention, the precuring in step (b-1) and the curing in step (b-2) takes place on a support.

In a particularly preferred embodiment of the present invention, the precuring in step (b-1) takes place on a support and the precured dispersion is detached from the support before the curing in step (b-2) takes place.

In a particularly preferred embodiment of the present invention, the precuring in step (b-1) is carried out in a mold and the precured dispersion is removed from the mold before the curing in step (b-2) takes place.

Preferably, the wavelength converting material is a substance having luminescent properties such as a phosphor or semiconductor nanoparticles. More preferably, the semiconductor nanoparticles are located on the surface of a non-activated crystalline material. The term "luminescent" is intended to include both, phosphorescent as well as fluorescent.

For the purposes of the present application, the type of phosphor is not particularly limited. Suitable phosphors are well known to the skilled person and can easily be obtained from commercial sources. For the purposes of the present application the term "phosphor" is intended to include materials that absorb in one wavelength of the electromagnetic spectrum and emit at a different wavelength.

Examples of suitable phosphors are inorganic fluorescent materials in particle form comprising one or more emitting centers. Such emitting centers may, for example, be formed by the use of so-called activators, which are preferably atoms or ions selected from the group consisting of rare earth elements, transition metal elements, main group elements and any combination of any of these. Example of suitable rare earth elements may be selected from the group consisting of La, Ce, Pr, Nd, Pm, Sm, Eu, Gd, Tb, Dy, Ho, Er, Tm, Yb and Lu. Examples of suitable transition metal elements may be selected from the group consisting of Cr, Mn, Fe, Co, Ni, Cu, Ag, Au and Zn. Examples of suitable main group elements may be selected from the group consisting of Na, Tl, Sn, Pb, Sb and Bi. Examples of suitable phosphors include phosphors based on garnet, silicate, orthosilicate, thiogallate, sulfide, nitride, silicon-based oxynitride, nitridosilicate, nitridoaluminumsilicate, oxonitridosilicate, oxonitridoaluminumsilicate and rare earth doped sialon.

Suitable yellow phosphors may, for example, comprise or be based on $(Gd,Y)_3(Al, Ga)_5O_{12}$ doped with Ce, such as the commercially available cerium-doped yttrium aluminum garnet (frequently abbreviated as "Ce:YAG" or "YAG:Ce"); or $Th_{3-x}M_xO_{12}$:Ce (TAG) with M being selected from the group consisting of Y, Gd, La and Lu; or $Sr_{2-x-y}Ba_xCa_ySiO_4$:Eu.

Examples of green phosphors may be selected from the group of $SrGa_2S_4$:Eu; $Sr_{2-y}Ba_ySiO_4$:Eu and/or $SrSi_2O_2N_2$:Eu.

Phosphors which may be employed as converter in the converting layer of the LED are, for example: $Ba_2SiO_4$:$Eu^{2+}$, $BaSi_2O_5$:$Pb^{2+}$, $Ba_xSr_{1-x}F_2$:$Eu^{2+}$ (wherein 0≤x≤1), $BaSrMgSi_2O_7$:$Eu^{2+}$, $BaTiP_2O_7$, $(Ba,Ti)_2P_2O_7$:Ti, $Ba_3WO_6$:U, $BaY_2F_8$:$Er^{3+}$,$Yb^+$, $Be_2SiO_4$:$Mn^{2+}$, $Bi_4Ge_3O_{12}$, $CaAl_2O_4$:$Ce^{3+}$, $CaLa_4O_7$:$Ce^{3+}$, $CaAl_2O_4$:$Eu^{2+}$, $CaAl_2O_4$:$Mn^{2+}$, $CaAl_4O_7$:$Pb^{2+}$, $Mn^{2+}$, $CaAl_2O_4$:$Tb^{3+}$, $Ca_3Al_2Si_3O_{12}$:$Ce^{3+}$, $Ca_3Al_2Si_3O_{12}$:$Eu^{2+}$, $Ca_2B_5O_9Br$:$Eu^{2+}$, $Ca_2B_5O_9Cl$:$Eu^{2+}$, $Ca_2B_5O_9C$:$Pb^{2+}$, $CaB_2O_4$:$Mn^{2+}$, $Ca_2B_2O_5$:$Mn^{2+}$, $CaB_2O_4$:$Pb^{2+}$, $CaB_2P_2O_9$:$Eu^{2+}$, $Ca_5B_2SiO_{10}$:$Eu^{3+}$, $Ca_{0.5}Ba_{0.5}Al_{12}O_{19}$:$Ce^{3+}$,$Mn^{2+}$, $Ca_2Ba_3(PO_4)_3Cl$:$Eu^{2+}$, $CaBr_2$:$Eu^{2+}$ in $SiO_2$, $CaCl_2$):$Eu^{2+}$ in $SiO_2$, $CaCl_2$:$Eu^{2+},Mn^{2+}$ in $SiO_2$, $CaF_2$:$Ce^{3+}$, $CaF_2$:$Ce^{3+},Mn^{2+}$, $CaF_2$:$Ce^{3+},Tb^{3+}$, $CaF_2$:$Eu^{2+}$, $CaF_2$:$Mn^{2+}$, $CaF_2$:U, $CaGa_2O_4$:$Mn^{2+}$, $CaGa_4O_7$:$Mn^{2+}$, $CaGa_2S_4$:$Ce^{3+}$, $CaGa_2S_4$:$Eu^{2+}$, $CaGa_2S_4$:$Mn^{2+}$, $CaGa_2S_4$:$Pb^{2+}$, $CaGeO_3$:$Mn^{2+}$, $CaI_2$:$Eu^{2+}$ in $SiO_2$, $CaI_2$:$Eu^{2+},Mn^{2+}$ in $SiO_2$, $CaLaBO_4$:$Eu^{3+}$, $CaLaB_3O_7$:$Ce^{3+},Mn^{2+}$, $Ca_2La_2BO_{6.5}$:$Pb^{2+}$, $Ca_2MgSi_2O_7$, $Ca_2MgSi_2O_7$:$Ce^{3+}$, $CaMgSi_2O_6$:$Eu^{2+}$, $Ca_3MgSi_2O_8$:$Eu^{2+}$, $Ca_2MgSi_2O_7$:$Eu^{2+}$, $CaMgSi_2O_6$:$Eu^{2+},Mn^{2+}$, $Ca_2MgSi_2O_7$:$Eu^{2+},Mn^{2+}$, $CaMoO_4$, $CaMoO_4$:$Eu^{3+}$, $CaO$:$Bi^{3+}$, $CaO$:$Cd^{2+}$, $CaO$:$Cu^+$, $CaO$:$Eu^{3+}$, $CaO$:$Eu^{3+}$, $Na^+$, $CaO$:$Mn^{2+}$, $CaO$:$Pb^{2+}$, $CaO$:$Sb^{3+}$, $CaO$:$Sm^{3+}$, $CaO$:$Tb^{3+}$, $CaO$:Tl, $CaO$:$Zn^{2+}$, $Ca_2P_2O_7$:$Ce^{3+}$, α-$Ca_3(PO_4)_2$:$Ce^{3+}$, β-$Ca_3(PO_4)_2$:$Ce^{3+}$, $Ca_5(PO_4)_3Cl$:$Eu^{2+}$, $Ca_5(PO_4)_3Cl$:$Mn^{2+}$, $Ca_5(PO_4)_3Cl$:$Sb^{3+}$, $Ca_5(PO_4)_3Cl$:$Sn^{2+}$, β-$Ca_3(PO_4)_2$:$Eu^{2+},Mn^{2+}$, $Ca_5(PO_4)_3F$:$Mn^{2+}$, $Ca_5(PO_4)_3F$:$Sb^{3+}$, $Ca_5(PO_4)_3F$:$Sn^{2+}$, α-$Ca_3(PO_4)_2$:$Eu^{2+}$, β-$Ca_3(PO_4)_2$:$Eu^{2+}$, $Ca_2P_2O_7$:$Eu^{2+}$, $Ca_2P_2O_7$:$Eu^{2+}$,$Mn^{2+}$, $CaP_2O_6$:$Mn^{2+}$, α-$Ca_3(PO_4)_2$:$Pb^{2+}$, α-$Ca_3(PO_4)_2$:$Sn^{2+}$, β-$Ca_3(PO_4)_2$:$Sn^{2+}$, β-$Ca_2P_2O_7$:Sn, Mn, α-$Ca_3(PO_4)_2$:Tr, $CaS$:$Bi^{3+}$, $CaS$:$Bi^{3+}$,Na, $CaS$:$Ce^{3+}$, $CaS$:$Eu^{2+}$, $CaS$:Cu+,Na+, $CaS$:$La^{3+}$, $CaS$:$Mn^{2+}$, $CaSO_4$:Bi, $CaSO_4$:$Ce^{3+}$, $CaSO_4$:$Ce^{3+},Mn^{2+}$, $CaSO_4$:$Eu^{2+}$, $CaSO_4$:$Eu^{2+},Mn^{2+}$, $CaSO_4$:$Pb^{2+}$, $CaS$:$Pb^{2+}$, $CaS$:$Pb^{2+}$,Cl, $CaS$:$Pb^{2+},Mn^{2+}$, $CaS$:$Pr^{3+},Pb^{2+}$,Cl, $CaS$:$Sb^{3+}$, $CaS$:$Sb^{3+}$,Na, $CaS$:$Sm^{3+}$, $CaS$:$Sn^{2+}$, $CaS$:$Sn^{2+}$,F, $CaS$:$Tb^{3+}$, $CaS$:$Tb^{3+}$,Cl, $CaS$:$Y^{3+}$, $CaS$:$Yb^{2+}$, $CaS$:$Yb^{2+}$,Cl, $CaSiO_3$:$Ce^{3+}$, $Ca_3SiO_4Cl_2$:$Eu^{2+}$, $Ca_3SiO_4Cl_2$:$Pb^{2+}$, $CaSiO_3$:$Eu^{2+}$, $CaSiO_3$:$Mn^{2+}$,Pb, $CaSiO_3$:$Pb^{2+}$, $CaSiO_3$:$Pb^{2+},Mn^{2+}$, $CaSiO_3$:$Ti^{4+}$, $CaSr_2(PO_4)_2$:$Bi^{3+}$, β-$(Ca,Sr)_3(PO_4)_2$:$Sn^{2+}Mn^{2+}$, $CaTi_{0.9}Al_{0.1}O_3$:$Bi^{3+}$, $CaTiO_3$:$Eu^{3+}$, $CaTiO_3$:$Pr^{3+}$, $Ca_5(VO_4)_3C_1$, $CaWO_4$, $CaWO_4$: $Pb^{2+}$, $CaWO_4$:W, $Ca_3WO_6$:U, $CaYAlO_4$:$EU^{3+}$, $CaYBO_4$:$Bi^{3+}$, $CaYBO_4$:$Eu^{3+}$, $CaYB_{0.8}O_{3.7}$:$Eu^{3+}$, $CaY_2ZrO_6$:$Eu^{3+}$, $(Ca,Zn,Mg)_3(PO_4)_2$:Sn, $CeF_3$, $(Ce,Mg)BaAl_{11}O_{18}$:Ce, $(Ce,Mg)SrAl_{11}O_{18}$:Ce, $CeMgAl_{11}O_{19}$:Ce:Tb, $Cd_2B_6O_{11}$:$Mn^{2+}$, $CdS$:$Ag^+$,Cr, $CdS$:In, $CdS$:In, $CdS$:In,Te, $CdS$:Te, $CdWO_4$, $CsF$, $CsI$, $CsI$:$Na^+$, $CsI$:Tl, $(ErCl_3)_{0.25}(BaI_2)_{0.75}$, $GaN$:Zn, $Gd_3Ga_5O_{12}$:$Cr^{3+}$, $Gd_3Ga_5O_{12}$:Cr,Ce, $GdNbO_4$:$Bi^{3+}$, $Gd_2O_2S$:$Eu^{3+}$, $Gd_2O_2SPr^{3+}$, $Gd_2O_2S$:Pr,Ce, F, $Gd_2O_2S$:$Tb^{3+}$, $Gd_2SiO_5$:$Ce^{3+}$, $KAl_{11}O_{17}$:Tl+, $KGa_{11}O_{17}$:$Mn^{2+}$, $K_2La_2Ti_3O_{10}$:Eu, $KMgF_3$:$Eu^{2+}$, $KMgF_3$:$Mn^{2+}$, $K_2SiF_6$:$Mn^{4+}$, $LaAl_3B_4O_{12}$:$Eu^{3+}$, $LaAlB_2O_6$:$Eu^{3+}$, $LaAlO_3$:$Eu^{3+}$, $LaAlO_3$:$Sm^{3+}$, $LaAsO_4$:$Eu^{3+}$, $LaBr_3$:$Ce^{3+}$, $LaBO_3$:$Eu^{3+}$, $(La,Ce,Tb)PO_4$:Ce:Tb, $LaCl_3$:$Ce^{3+}$, $La_2O_3$:$Bi^{3+}$, $LaOBr$:$Tb^{3+}$, $LaOBr$:$Tm^{3+}$, $LaOCl$:$Bi^{3+}$, $LaOCl$:$Eu^{3+}$, $LaOF$:$Eu^{3+}$, $La_2O_3$:$Eu^{3+}$, $La_2O_3$:$Pr^{3+}$, $La_2O_2S$:$Tb^{3+}$, $LaPO_4$:$Ce^{3+}$, $LaPO_4$:$Eu^{3+}$, $LaSiO_3Cl$:$Ce^{3+}$, $LaSiO_3Cl$:$Ce^{3+},Tb^{3+}$, $LaVO_4$:$Eu^{3+}$, $La_2W_3O_{12}$:$Eu^{3+}$, $LiAlF_4$:$Mn^{2+}$, $LiAl_5O_8$:$Fe^{3+}$, $LiAlO_2$:$Fe^{3+}$, $LiAlO_2$:$Mn^{2+}$, $LiAl_5O_8$:$Mn^{2+}$, $Li_2CaP_2O_7$:$Ce^{3+},Mn^{2+}$, $LiCeBa_4Si_4O_{14}$:$Mn^{2+}$, $LiCeSrBa_3Si_4O_{14}$:$Mn^{2+}$, $LiInO_2$:$Eu^{3+}$, $LiInO_2$:$Sm^{3+}$, $LiLaO_2$:$Eu^{3+}$, $LuAlO_3$:$Ce^{3+}$, $(Lu,Gd)_2SiO_5$:$Ce^{3+}$, $Lu_2SiO_5$:$Ce^{3+}$, $Lu_2Si_2O_7$:$Ce^{3+}$, $LuTaO_4$:$Nb^{5+}$, $Lu_{1-x}YXAlO_3$:$Ce^{3+}$ (wherein 0≤x≤1), $MgAl_2O_4$:$Mn^{2+}$, $MgSrAl_{10}O_{17}$:Ce, $MgB_2O_4$:$Mn^{2+}$, $MgBa_2(PO_4)_2$:$Sn^{2+}$, $MgBa_2(PO_4)_2$:U, $MgBaP_2O_7$:$Eu^{2+}$, $MgBaP_2O_7$:$Eu^{2+},Mn^{2+}$, $MgBa_3Si_2O_8$:$Eu^{2+}$, $MgBa(SO_4)_2$:$Eu^{2+}$, $Mg_3Ca(PO_4)_4$:$Eu^{2+}$, $MgCaP_2O_7$:$Mn^{2+}$, $Mg_2Ca(SO_4)_3$:$Eu^{2+}$, $Mg_2Ca(SO_4)_3$:$Eu^{2+},Mn^2$, $MgCeAl_{11}O_{19}$:$Tb^{3+}$, $Mg_4(F)GeO_6$:$Mn^{2+}$, $Mg_4(F)(Ge,Sn)O_6$:$Mn^{2+}$, $MgF_2$:$Mn^{2+}$, $MgGa_2O_4$:$Mn^{2+}$, $Mg_8Ge_2O_{11}F_2$:$Mn^{4+}$, $MgS$:$Eu^{2+}$, $MgSiO_3$:$Mn^{2+}$, $Mg_2SiO_4$:$Mn^{2+}$, $Mg_3SiO_3F_4$:$Ti^{4+}$, $MgSO_4$:$Eu^{2+}$, $MgSO_4$:$Pb^{2+}$, $(Mg,Sr)Ba_2Si_2O_7$:$Eu^{2+}$, $MgSrP_2O_7$:$Eu^{2+}$, $MgSr_5(PO_4)_4$:$Sn^{2+}$, $MgSr_3Si_2O_8$:$Eu^{2+},Mn^{2+}$, $Mg_2Sr(SO_4)_3$:$Eu^{2+}$, $Mg_2TiO_4$:$Mn^{4+}$, $MgWO_4$, $MgYBO_4$:$Eu^{3+}$, $Na_3Ce(PO_4)_2$:$Tb^{3+}$, $NaI$:Tl, $Na_{1.23}K_{0.42}Eu_{0.12}TiSi_4O_{11}$:$Eu^{3+}$, $Na_{1.23}K_{0.42}Eu_{0.12}TiSi_5O_{13}$·x$H_2O$:$EU^{3+}$, $Na_{1.29}K_{0.46}Er_{0.08}TiSi_4O_{11}$:$Eu^{3+}$, $Na_2Mg_3Al_2Si_2O_{10}$:Tb, $Na(Mg_{2-x}Mn_x)LiSi_4O_{10}F_2$:Mn (wherein 0≤x≤2), $NaYF_4$:$Er^{3+}$, $Yb^{3+}$, $NaYO_2$:$Eu^{3+}$, P46(70%)+P47 (30%), $SrAl_{12}O_{19}$:$Ce^{3+}$, $Mn^{2+}$, $SrAl_2O_4$:$Eu^{2+}$, $SrAl_4O_7$:$Eu^{3+}$, $SrAl_{12}O_{19}$:$Eu^{2+}$, $SrAl_2S_4$:$Eu^{2+}$, $Sr_2B_5O_9Cl$:$Eu^{2+}$, $SrB_4O_7$:$Eu^{2+}$ (F,Cl, Br), $SrB_4O_7$:$Pb^{2+}$, $SrB_4O_7$:$Pb^{2+}$, $Mn^{2+}$, $SrB_8O_{13}$:$Sm^{2+}$, $Sr_xBa_yCl_zAl_2O_{4-z/2}$: $Mn^{2+}$, $Ce^{3+}$, $SrBaSiO_4$:$Eu^{2+}$, $Sr(Cl,Br,I)_2$:$Eu^{2+}$ in $SiO_2$, $SrCl_2$:$Eu^{2+}$ in $SiO_2$, $Sr_5Cl(PO_4)_3$:Eu, $Sr_wF_xB_4O_{6.5}$:$Eu^{2+}$, $Sr_wF_xB_yO_z$:$E^2$,$Sm^{2+}$, $SrF_2$:$Eu^{2+}$, $SrGa_{12}O_{19}$:$Mn^{2+}$, $SrGa_2S_4$:$Ce^{3+}$, $SrGa_2S_4$:$Eu^{2+}$, $SrGa_2S_4$:$Pb^{2+}$, $SrIn_2O_4$:$Pr^{3+}$, $Al^{3+}$, $(Sr,Mg)_3(PO_4)_2$:Sn, $SrMgSi_2O_6$:$Eu^{2+}$, $Sr_2MgSi_2O_7$:$Eu^{2+}$, $Sr_3MgSi_2O_8$:$Eu^{2+}$, $SrMoO_4$:U, $SrO.3B_2O_3$:$Eu^{2+}$,Cl, β-$SrO.3B_2O_3$:$Pb^{2+}$, β-$SrO.3B_2O_3$:$Pb^{2+},Mn^{2+}$, α-$SrO.3B_2O_3$:$Sm^{2+}$, $Sr_6P_5BO_{20}$:Eu, $Sr_5(P_4)_3GCl$:$Eu^{2+}$, $Sr_5(PO_4)_3GC$:$Eu^{2+},Pr^{3+}$, $Sr_5(PO_4)_3GC$:$Mn^{2+}$, $Sr_5(PO_4)_3GC$:$Sb^{3+}$, $Sr_2P_2O_7$:$Eu^{2+}$, $R^3$—$Sr_3(PO_4)_2$:$Eu^{2+}$, $Sr_5(PO_4)_3F$:$Mn^{2+}$, $Sr_5(PO_4)_3F$:$Sb^{3+}$, $Sr_5(PO_4)_3F:Sb^{3+},Mn^{2+}$, $Sr_5(PO_4)_3F:Sn^{2+}$, $Sr_2P_2O_7:Sn^{2+}$, $\beta\text{-}Sr_3(PO_4)_2:Sn^{2+}$, $\beta\text{-}Sr_3(PO_4)_2:Sn^{2+},Mn^{2+}$ (Al), $SrS:Ce^{3+}$, $SrS:Eu^{2+}$, $SrS:Mn^{2+}$, $SrS:Cu+,Na$, $SrSO_4:Bi$, $SrSO_4:Ce^{3+}$, $SrSO_4:Eu^{2+}$, $SrSO_4:Eu^{2+},Mn^{2+}$, $Sr_5Si_4O_{10}Cl_6:Eu^{2+}$, $Sr_2SiO_4:Eu^{2+}$, $SrTiO_3:Pr^{3+}$, $SrTiO_3:Pr^{3+},Al^{3+}$, $Sr_3WO_6:U$, $SrY_2O_3:Eu^{3+}$, $ThO_2:Eu^{3+}$, $ThO_2:Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+},Mn$, $YAl_3B_4O_{12}:Ce^{3+},Tb^{3+}$, $YAl_3B_4O_{12}:Eu^{3+}$, $YAl_3B_4O_{12}:Eu^{3+},Cr^{3+}$, $YAl_3B_4O_{12}:Th^{4+},Ce^{3+},Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3AlO_2:Eu^3r$, $Y_4Al_2O_9:Eu^{3+}$, $Y_3Al_5O_{12}:Mn^{4+}$, $YAlO_3:Sm^{3+}$, $YAlO_3:Tb^{3+}$, $Y_3Al_5O_{12}:Tb^{3+}$, $YAsO_4:Eu^{3+}$, $YBO_3:Ce^{3+}$, $YBO_3:Eu^{3+}$, $YF_3:Er^{3+},Yb^{3+}$, $YF_3:Mn^{2+}$, $YF_3:Mn^{2+},Th^{4+}$, $YF_3:Tm^{3+},Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3(Eu,Pr)$, $Y_2O_3:Bi^{3+}$, $YOBr:Eu^{3+}$, $Y_2O_3:Ce$, $Y_2O_3:Er^{3+}$, $Y_2O_3:Eu^{3+}$ (YOE), $Y_2O_3:Ce^{3+},Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{2+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+},Tb^{3+}$, $YPO_4:Eu^{3+}$, $YPO_4:Mn^{2+},Th^{4+}$, $YPO_4:V^{5+}$, $Y(P,V)_{O4}:Eu$, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2SiO_4:Mn^{2+}$, $Zn_{0.4}Cd_{0.6}S:Ag$, $Zn_{0.6}Cd_{0.4}S:Ag$, $(Zn,Cd)S:Ag,Cl$, $(Zn,Cd)S:Cu$, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+},Ga^{3+}$, $ZnO:Bi^{3+}$ $ZnO:Ga^{3+}$, $ZnO:Ga$, $ZnO\text{—}CdO:Ga$, $ZnO:S$, $ZnO:Se$, $ZnO:Zn$, $ZnS:Ag+,Cl^-$, $ZnS:Ag,Cu,Cl$, $ZnS:Ag,Ni$, $ZnS:Au,In$, $ZnS\text{—}CdS$ (25-75), $ZnS\text{—}CdS$ (50-50), $ZnS\text{—}CdS$ (75-25), $ZnS\text{—}CdS:Ag,Br,Ni$, $ZnS\text{—}CdS:Ag+,Cl$, $ZnS\text{—}CdS:Cu,Br$, $ZnS\text{—}CdS:Cu,I$, $ZnS:Cl^-$, $ZnS:Eu^{2+}$, $ZnS:Cu$, $ZnS:Cu^+,Al^{3+}$, $ZnS:Cu+,Cl^-$, $ZnS:Cu,Sn$, $ZnS:Eu^{2+}$, $ZnS:Mn^{2+}$, $ZnS:Mn,Cu$, $ZnS:Mn^{2+},Te^{2+}$, $ZnS:P$, $ZnS:P^{3-},Cl^-$, $ZnS:Pb^{2+}$, $ZnS:Pb^{2+},Cl^-$, $ZnS:Pb,Cu$, $Zn_3(PO_4)_2:Mn^{2+}$, $Zn_2SiO_4:Mn^{2+}$, $Zn_2SiO_4:Mn^{2+},As^{5+}$, $Zn_2SiO_4:Mn,Sb_2O_2$, $Zn_2SiO_4:Mn^{2+},P$, $Zn_2SiO_4:Ti^{4+}$, $ZnS:Sn^{2+}$, $ZnS:Sn,Ag$, $ZnS:Sn^{2+},Li+$, $ZnS:Te,Mn$, $ZnS\text{—}ZnTe:Mn^{2+}$, $ZnSe:Cu^+,Cl$ and/or $ZnWO_4$.

In a preferred embodiment of the present invention the dispersion contains a crosslinkable material and at least one phosphor, more preferably one, two or three or more phosphors in combination.

For the purpose of the present application, the type of semiconductor nanoparticle converter is not particularly limited. Such converters may be semiconductor nanoparticles (quantum materials) or semiconductor nanoparticles (quantum materials) on the surface of non-activated crystalline materials as known from WO 2017/041875 A1.

In a preferred embodiment of the present invention the dispersion contains a crosslinkable material and at least one semiconductor nanoparticle converter, more preferably two, three or more semiconductor nanoparticle converters in combination.

In a particularly preferred embodiment of the present invention the dispersion contains a crosslinkable material and at least one phosphor and at least one semiconductor nanoparticle converter in combination.

Wavelength Converting Component

The present invention provides in a first embodiment a wavelength converting component which is obtainable or obtained by the manufacturing method as described hereinabove.

The matrix material in the wavelength converting component shows particular physical features describing its semi-ceramic state such as the following features (1) to (6):
(1) The matrix material has a hardness according to Shore-D (Shore-D hardness) of ≥75.
(2) The matrix material has a thermal conductivity of ≥0.3 W/(m·K) at 25° C. Preferably, the thermal conductivity of the matrix material is ≤5.0 W/(m·K), more preferably ≤3.0 W/(m·K), at 25° C.
(3) The matrix material has a density of ≥1.16 g/cm$^3$, preferably of ≥1.21 g/cm$^3$, at 25° C. Preferably, the density of the matrix material is ≤2.50 g/cm$^3$, more preferably ≤2.20 g/cm$^3$, at 25° C.
(4) The matrix material has a coefficient of thermal expansion (CTE) of ≤150 ppm/K in a temperature range from 25 to 80° C. Preferably, the CTE of the matrix material is ≥10 ppm/K, more preferably ≥20 ppm/K, in a temperature range from 25 to 80° C.
(5) The matrix material is characterized by the absence of Si—H groups as analyzed by infrared (IR) spectroscopy, which means that there are no Si—H vibration bands at 2050 to 2250 cm$^{-1}$ in the IR spectrum.
(6) The matrix material shows a weight loss of ≤0.5 weight-%, upon heating from 25 to 350° C. under air atmosphere.

The physical features (1) to (6) are obtained by the measurement methods as described below in the examples.

The physical features (1) to (6), either alone or in any combination, may characterize the wavelength converting component and describe the semi-ceramic state of the matrix material resulting from a high degree of crosslinking due to high curing temperatures.

Particularly preferred physical features characterizing the semi-ceramic state of the matrix material are:
(3) a density of ≥1.16 and ≤2.50 g/cm$^3$, most preferably of ≥1.21 and ≤2.20 g/cm$^3$, at 25° C.
(4) a coefficient of thermal expansion (CTE) of ≤150 and ≥10 ppm/K, most preferably of ≤150 and ≥20 ppm/K, in a temperature range from 25 to 80° C.
(5) the absence of Si—H groups as analyzed by infrared (IR) spectroscopy, which means that there are no Si—H vibration bands at 2050 to 2250 cm$^{-1}$ in the IR spectrum.

It is preferred that the wavelength converting components of the first embodiment is further characterized by one or more of the physical features (1) to (6) shown above.

In a second embodiment of the present invention there is provided a wavelength converting component containing at least one wavelength converting material embedded in a matrix material, wherein the matrix material contains Si—N bonds and wherein the matrix material has a density of ≥1.16 g/cm$^3$, preferably of ≥1.21 g/cm$^3$, at 25° C. It is preferred that the density of the matrix material is ≤2.50 g/cm$^3$, more preferably ≤2.20 g/cm$^3$, at 25° C.

It is preferred that the wavelength converting components of the second embodiment is further characterized by one or more of the physical features (1), (2) and (4) to (6) shown above.

In a third embodiment of the present invention there is provided a wavelength converting component containing at least one wavelength converting material embedded in a matrix material, wherein the matrix material contains Si—N bonds and wherein the matrix material has a coefficient of thermal expansion of ≤150 ppm/K in a temperature range from 25 to 80° C. It is preferred that the CTE of the matrix material is ≥10 ppm/K, more preferably ≥20 ppm/K, in a temperature range from 25 to 80° C.

It is preferred that the wavelength converting components of the third embodiment is further characterized by one or more of the physical features (1) to (3), (5) and (6) shown above.

Light Source

There is further provided a light source comprising a primary light source and a wavelength converting component according to the present invention.

Preferred primary light sources are semiconductor light emitting sources such as semiconductor light emitting diodes (LED chips) or semiconductor laser diodes (LD chips).

Preferred LED chips comprise a luminescent indium aluminum gallium nitride, in particular of the formula $In_iGa_jAl_kN$, where $0 \le i$, $0 \le j$, $0 \le k$, and $i+j+k=1$. In a further preferred embodiment, the LED chip is a luminescent arrangement based on ZnO, TCO (transparent conducting oxide), ZnSe or SiC.

It is preferred that the light source of the present invention is a high power LED, an ultra-high power LED or a laser LED.

The light source of the present invention preferably emits white light or light having a certain colour point (colour-on-demand principle). The colour-on-demand concept is taken to mean the production of light having a certain colour point using a pc-LED (=phosphor-converted LED) using one or more phosphors.

In a preferred embodiment the wavelength converting component is either arranged directly on the primary light source or alternatively arranged remote therefrom, depending on the respective type of application (the latter arrangement also includes "remote phosphor technology") (FIG. 4). The advantages of remote phosphor technology are known to the person skilled in the art and are revealed, for example, by the following publication: Japanese J. of Appl. Phys. Vol. 44, No. 21 (2005), L649-L651.

Figure 6:
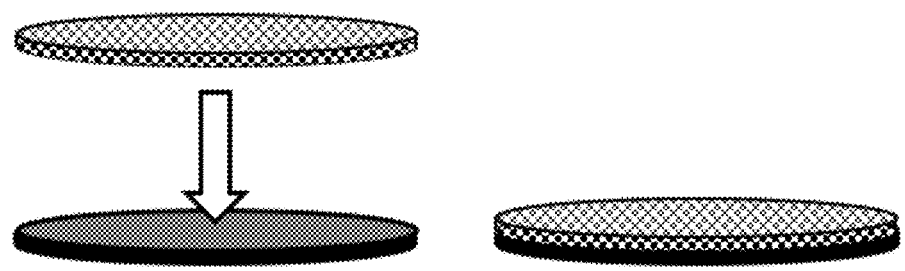
FIG. 6: Placement of wavelength converting component on a LED wafer prior to dicing.
Figure 7:
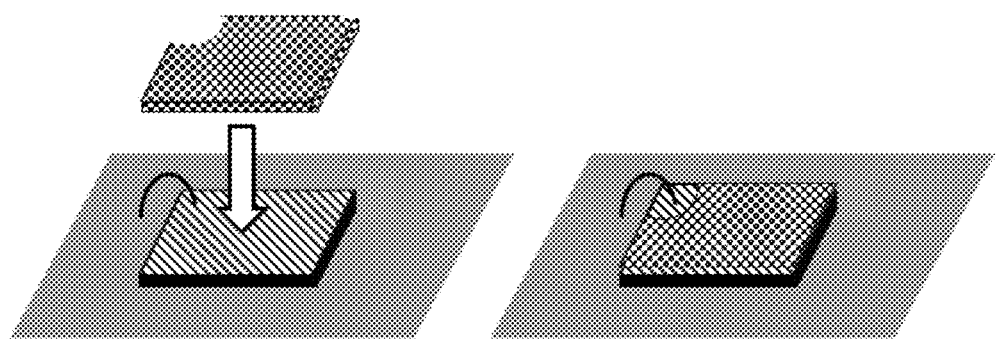
FIG. 7: Placement of wavelength converting component on a singularized LED chip.

The wavelength converting component can be placed either on the LED wafer prior to dicing as shown in FIG. 6 or on the singularized LED chip as shown in FIG. 7.

The optical coupling between the primary light source and the wavelength converting component can also be achieved by a light-conducting arrangement. This makes it possible for the primary light source to be installed at a central location and to be optically coupled to the converter by means of light-conducting devices, such as, for example, optical fibers. In this way, it is possible to achieve lamps adapted to the lighting wishes which merely consist of one or more types of wavelength converting material, which can be arranged to form a light screen, and an optical waveguide, which is coupled to the primary light source. In this way, it is possible to place a strong primary light source at a location which is favourable for electrical installation and to install lamps comprising wavelength converting material which are coupled to the optical waveguides at any desired locations without further electrical cabling, but instead only by laying optical wave-guides.

It is preferred that the light source according to the present invention is used for projectors (image projectors) or automotive lighting.

Lighting Unit

There is further provided a lighting unit, in particular for projectors (image projectors) or automotive lighting, wherein the lighting unit comprises at least one of the inventive light sources.

Figure 2:
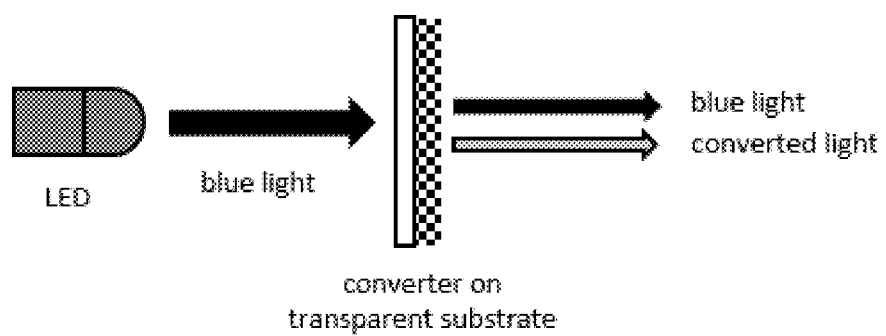
FIG. 2: Schematic drawing of a wavelength converting component used in an automotive lighting unit or in a projector lighting unit, e.g. in form of a colour wheel, in transmission mode.
Figure 3:
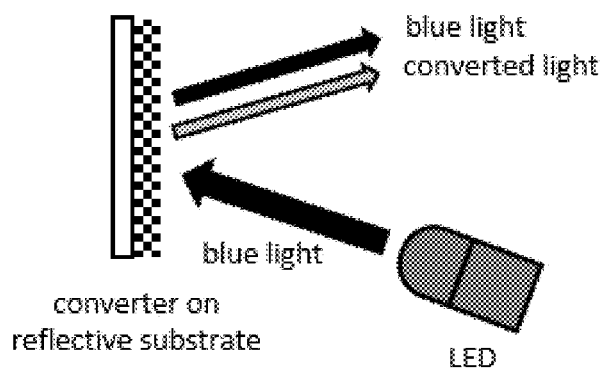
FIG. 3: Schematic drawing of a wavelength converting component used in an automotive lighting unit or in a projector lighting unit, e.g. in form of a colour wheel, in reflective mode.

For light conversion in laser LEDs, e.g. in the automotive environment, the wavelength converting component in the lighting unit can be used in transmission mode (FIG. 2) or in refection mode (FIG. 3).

For light conversion in laser LEDs, e.g. in projectors, the wavelength converting component in the lighting unit can be used on a colour wheel, as for example described in "https://www.christiedigital.com/en-us/display-technology/laser-projection/laser-phosphor-projection".

Use

The wavelength converting component of the present invention may be used for the conversion of blue, violet and/or UV light from a primary light source into light with a longer wavelength. It is preferred that the primary light source is a semiconductor light emitting diode (LED chip) or a semiconductor laser diode (LD chip).

The present invention is further illustrated by the examples following hereinafter which shall in no way be construed as limiting. The skilled person will acknowledge that various modifications, additions and alternations may be made to the invention without departing from the spirit and scope of the invention as defined in the appended claims.

EXAMPLES

General Procedures

The wavelength converting material is made by mixing organopolysilazanes, organopolysiloxazanes or PHPS and wavelength converting particles and heating the mixture over two stages to temperatures of >250 to ≤500° C. At temperatures between 250 and 500° C. the silazane and/or siloxazane polymer crosslinks to a very dense polymer. This polymer is herein called "semi-ceramic material". It shows no discolouration at temperatures of up to 300° C. and has good barrier properties due to the high crosslinking degree.

Figure 5:
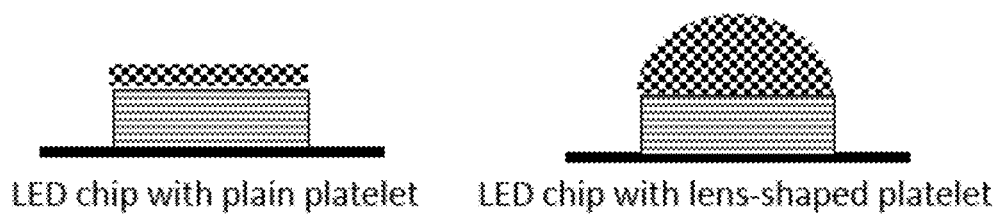
FIG. 5: Wavelength converting component as plain platelet or lens-like part in a light source.

A major advantage of this approach is the liquid precursor dispersion, which can be easily poured into various molds and then cured to form a solid part. By this method, parts of various shapes, for example plain platelets or lens-like parts can be prepared (FIG. 5).

Alternatively, it is possible to apply the liquid formulation on a LED wafer or a LD wafer by spin-coating or slot-die coating (wafer level coating) (FIG. 6). There is no need for a very small sized wavelength converting material, all usual particle sizes of typically ≥3 to ≤30 μm are possible. After attach-ing the wavelength converting component onto a high power LED chip, ultra-high power LED chip or LD chip, the light source can be run at very high current. Then the wavelength converting component reaches temperatures of >200° C. without any yellowing. There is no change in colour point observable during a long-time reliability test. An additional advantage is the good barrier property of the semi-ceramic material against water and moisture permeation. It protects sensitive phosphor materials against degradation under high humidity conditions. The improved thermal conductivity of the highly crosslinked material is an additional advantage.

The heat generated by the Stokes shift in the phosphor particles is easier dissipated.

Characterization of the Wavelength Converting Component

Material Properties

To demonstrate the change of material properties by heat induced crosslinking, various physical parameters were analyzed after 120° C. cure and after temperature treatment up to 350° C. The material used was an organopolysiloxazane having the following structure:

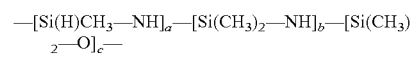

wherein a:b:c=60:20:20. The material was cured at a temperature of 120° C. for 16 h on a hot plate in ambient atmosphere. After curing the material was solid and was then subsequently heated to 150° C., 200° C., 250° C., 300° C. and 350° C., respectively, each temperature for 24 h in an oven at air atmosphere.

Coefficient of Thermal Expansion (CTE)

Figure 8:
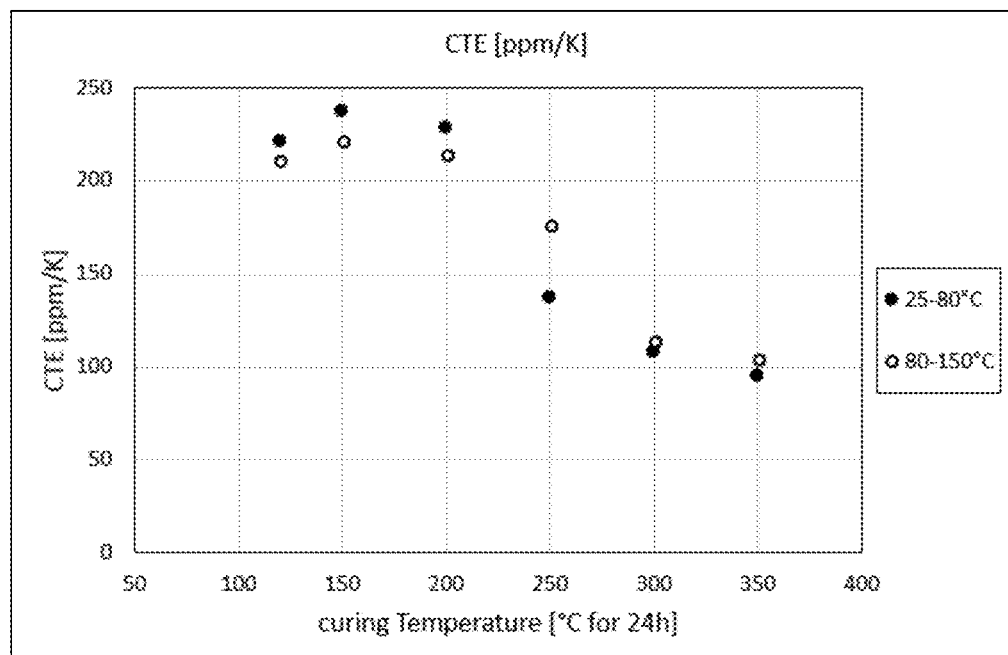
FIG. 8: Temperature dependent coefficient of thermal expansion (CTE).
● =average CTE in a temperature range from 25 to 80° C.;
○ =average CTE in a temperature range from 80 to 150° C.

The semi-ceramic material is characterized by an average CTE of <150 ppm/K in a temperature range of 25° C.-80° C. and of <180 ppm/K in a temperature range of 80° C.-150° C. (see FIG. 8).

Hardness

The semi-ceramic material has a Shore-D hardness at 25° C. of >75 (see Table 1).

The coefficient of thermal expansion (CTE) was measured using a Mettler-Toledo TMA/SDTA 1 System. Parts of a column-like shape with a diameter of 6 mm and a height of 6 mm were prepared and cured at the temperatures and times shown in FIG. 8. The CTE was measured at a heating rate of 2.5 K/min and the slope of the specimens height vs. temperature was evaluated in a temperature range from 25 to 80° C. and from 80 to 150° C.

The Shore-D hardness was measured using a Elcometer 3120 Shore Durometer. A film of 1 mm thickness was prepared and cured at the conditions shown in Table 1.

TABLE 1

Dependence of the Shore D hardness on curing conditions.

| | Curing conditions | | | | | |
|---|---|---|---|---|---|---|
| | 120° C. for 24 h | +150° C. for 24 h | +200° C. for 24 h | +250° C. for 24 h | +300° C. for 24 h | +350° C. for 24 h |
| Shore D Hardness | 15 | 35 | 60 | 75 | >75 | >75 |

Thermal Conductivity

The semi-ceramic material has a thermal conductivity of >0.3 W/(m*K) (see Table 2).

Thermal conductivity was measured with a Netzsch LFA 457 MicroFlash Laser Flash Apparatus. A part with a disc-like shape of 12 mm diameter and a height of 2 mm was prepared and cured at the conditions shown in Table 2.

TABLE 2

Dependence of thermal conductivity on curing conditions.

| | Curing conditions | | | | | |
|---|---|---|---|---|---|---|
| | 120° C. for 24 h | +150° C. for 24 h | +200° C. for 24 h | +250° C. for 24 h | +300° C. for 24 h | +350° C. for 24 h |
| Thermal conductivity [W/(m*K)] | 0.18 | 0.20 | 0.22 | 0.26 | >0.3 | >0.3 |

Density

Figure 9:
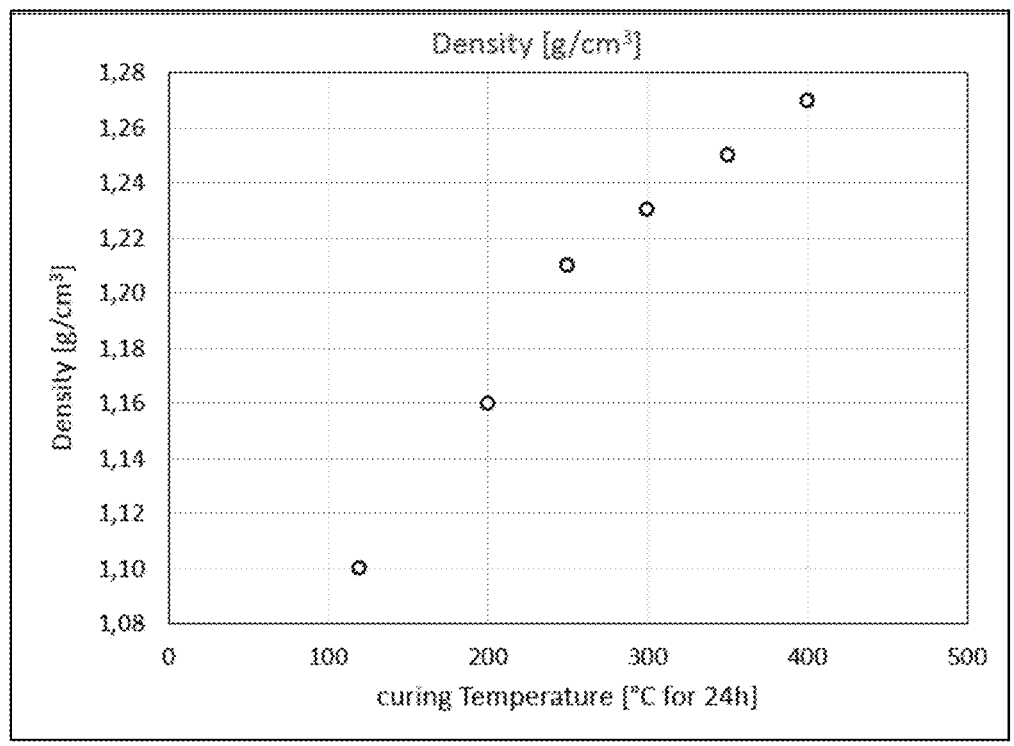
FIG. 9: Temperature dependent density.
○ =density.

The semi-ceramic material has a density of ≥1.16 g/cm$^3$ (FIG. 9). The density was measured using a He Pycnometry Tool: Pycnometer AccuPyc™ 1330 Micrometrics™, Model 133/34010/00 according to method DIN 66137-2: Determination of solid state density, Part 2 Gaspycnometry.

Presence of Organic Groups

Figure 10:
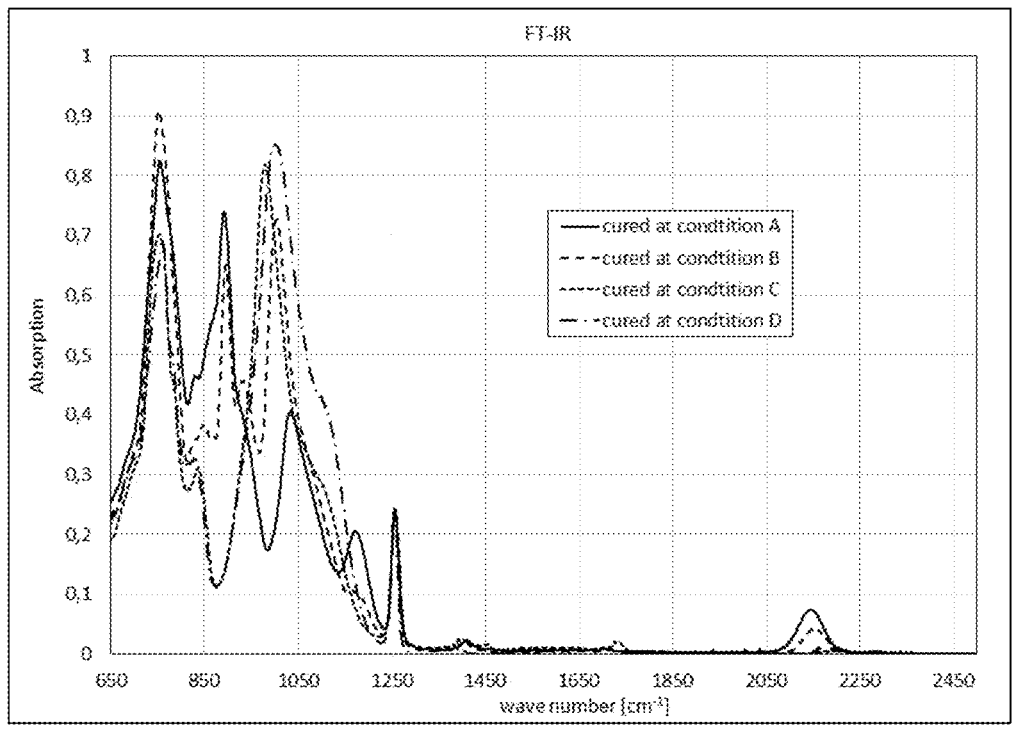
FIG. 10: Presence of organic groups and absence of Si—H groups detected by FT-IR.
——— =condition A: material cured at 120° C. for 4 h;
- - - - - - =condition B: A+additional heating at 200° C. for 24 h in air;
· · · · · · · =condition C: B+additional heating at 300° C. for 24 h in air;
- · - · - · - =condition D: C+additional heating at 350° C. for 24 h in air.

The semi-ceramic material still contains organic groups (FIG. 10). In FIG. 10 the signal of the Si—CH$_3$ group vibration at 1250 to 1260 cm$^{-1}$ remains unchanged.

Absence of Si—H Groups

The semi-ceramic material is characterized by the absence of silicon-hydrogen groups (see FIG. 10). In FIG. 10 the signal of the Si—H group vibration at 2050 to 2250 cm$^{-1}$ disappears at T>250° C.

Thermogravimetric Analysis (TGA)

Figure 11:
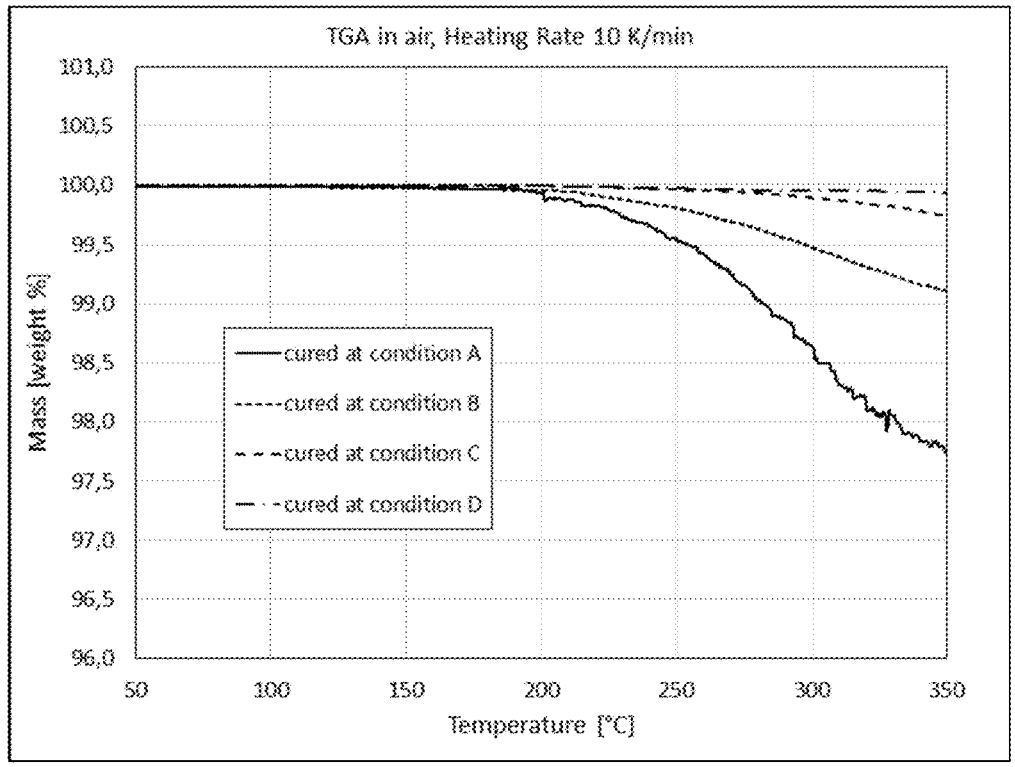
FIG. 11: Thermogravimetric analysis (TGA) in air atmosphere with a heating rate of 10 K/min.
—————— =condition A: material cured at 120° C. for 4 h;
- - - - - - - =condition B: A+additional heating at 200° C. for 24 h in air;
· · · · · · · · =condition C: B+additional heating at 250° C. for 24 h in air;
- · - · - · - =condition D: C+additional heating at 400° C. for 24 h in air.

The semi-ceramic material shows a weight loss analyzed by TGA in air atmosphere of <0.5 weight-% after heating up to 350° C. (see FIG. 11).

Measurement Methods

Molecular weights of polymers were determined by GPC against a polystyrene standard. As eluent a mixture of tetrahydrofuran and 1.45 weight-% (relative to the total weight of the eluent) hexamethyldisilazane was used. Columns were Shodex KS-804 and 2×KS-802 and KS-801. The detector was an Agilent 1260 refractive index detector.

Viscosity was determined using a Brookfield Rheometer R/S plus with a Brookfield cone-type spindle RC3-50-1 at a rotation speed of 3 rpm and a temperature of 25° C.

A film of 1 mm thickness was prepared and cured at the conditions shown in FIG. 9. The cured film was grinded to powder and the density was measured. The density was measured using a He Pycnometry Tool: Pycnometer AccuPyc™ 1330 Micrometrics™, Model 133/34010/00 according to method DIN 66137-2: Determination of solid state density, Part 2 Gaspycnometry.

The presence of organic groups was measured by FT-IR spectroscopy using a Perkin-Elmer Frontier FT-IR Spectrometer in ATR mode. A 150 μm film was coated on a glass plate, cured at the temperatures shown in FIG. 10 and the FT-TR spectrum was measured in ATR mode.

The absence of Si—H groups was measured by FT-IR spectroscopy using a Perkin-Elmer Frontier FT-IR Spectrometer in ATR mode. A 150 μm film was coated on a glass plate, cured at the temperatures shown in FIG. 10 and the FT-TR spectrum was measured in ATR mode. Si—H groups are absent, if there are no signals of the Si—H group vibration at 2050 to 2250 cm$^{-1}$ in the IR spectrum.

The thermogravimetric analysis (TGA) was done using a Mettler-Toledo TGA-2 Thermogravimetric Analyzer. A film of 0.5 mm thickness was prepared and cured at the conditions shown in FIG. 11. The cured film was grinded to powder and the TGA was measured at a heating rate of 10 K/min under air atmosphere The emission spectra and the colour point of the coated LEDs were measured using an Instrument System Spectrometer CAS 140CT in combination with an Instrument System Integration sphere ISP 150.

The angular radiation intensity of the coated LEDs were measured using an Instrument System Spectrometer CAS 140CT in combination with an Instrument System Goniophotometer LEDGON.

Preparation

Table 3 shows the composition of the dispersions and curing conditions used for Examples 1 to 11.

TABLE 3

Examples 1 to 11.

| Ex. | Precursor | Phosphor | Ratio Precursor:Phosphor | Support | Cat. | Curing temperature | Curing atmosphere |
|---|---|---|---|---|---|---|---|
| 1 | Material A | YAG* | 1:2.5 | PTFE plate | AlPh$_3$ | 50 + 325° C. | Air |
| 2 | Material A | YAG* | 1:2.5 | PTFE plate | — | 150° C. | Air |
| 3 | Material A | YAG* + OGA** | 1:1.7:0.8 | PTFE plate | — | 150 + 325° C. | Air |
| 4 | Material B | YAG* + OGA** | 1:1.7:0.8 | PTFE plate | — | 150 + 325° C. | Air |
| 5 | Material B | YAG* | 1:2.5 | PTFE mold | AlPh$_3$ | 50 + 325° C. | Air |
| 6 | PHPS | YAG* | 1:2.5 | PTFE mold | — | 150 + 350° C. | Air |
| 7 | PHPS | YAG* | 1:2.5 | Glass plate | — | 150 + 350° C. | Air |
| 8 | PHPS | Thiogallate*** | 1:2.5 | Glass plate | — | 150 + 350° C. | Air |
| 9 | Material B | YAG* | 1:2.5 | Glass plate | — | 150 + 325° C. | Air |
| 10 | Material A | Thiogallate*** | 1:2.5 | Glass plate | — | 150 + 325° C. | Air |
| 11 | Material A | Thiogallate*** | 1:2.5 | PTFE plate | AlPh$_3$ | 50 + 325° C. | Air |

*YAG = Isiphor ® YYG 545 200, available from Merck KGaA.
**OGA = Isiphor ® OGA 600 500, available from Merck KGaA.
***Thiogallate = BUVG01 (Calcium Strontium Gallium Sulfoselenide doped with Europium), available from PHOSPHORTECH CORPORATION Atlanta/USA Material A is an organopolysilazane made of Cl—Si(H)CH$_3$—Cl and Cl—Si(CH$_3$)$_2$—Cl in a ratio of 1:1 and ammonia with an average molecular weight of 4,500 g/mol determined by GPC. This material is available from Merck KGaA under the tradename Durazane 1050.

Material B is an organopolysiloxazane having an average molecular weight of 4,750 g/mol (determined by GPC) which was prepared according to the following procedure:

A 4 l pressure vessel was charged with 1500 g of liquid ammonia at 0° C. and set under a pressure between 3 bar and 5 bar. A mixture of 442 g dichloromethylsilane and 384 g 1,3-dichlorotetramethyldisiloxane was slowly added over a period of 3 h. After stirring the resulting reaction mixture for additional 3 h the stirrer was stopped and the lower phase was isolated and evaporated to remove dissolved ammonia. After filtration 429 g of a colourless viscous oil remained.

100 g of the obtained colourless viscous oil was dissolved in 100 g 1,4-dioxane and cooled to 0° C. 100 mg KH was added and the reaction solution was stirred for 4h until gas formation stopped. 300 mg chlorotrimethylsilane and 250 g xylene were added and the temperature was raised to room temperature. The turbid solution was filtrated and the resulting clear solution was reduced to dryness at a temperature of 50° C. under a vacuum of ≤20 mbar to obtain 95 g of a colorless highly viscous oil.

Example 1

A mixture of 10 g organopolysilazane Material A, 0.05 g triphenylaluminum (AlPh$_3$), 1.5 g heptane and 25 g YAG phosphor was coated on a PTFE plate with a plain surface at a film thickness of 100 µm. The material was cured for 16 h under air atmosphere at a temperature of 50° C. The cured film was then removed from the PTFE support and a 1 mm×1 mm piece having a recess at one edge to fit on a LED chip (as shown in FIG. 7) was cut. The piece was then cured for additional 16 h under air atmosphere at a temperature of 325° C.

Example 2

A mixture of 10 g organopolysilazane Material A, 1.5 g heptane and 25 g of YAG phosphor was coated on a PTFE plate with a plain surface at a film thickness of 100 µm. The material was cured for 16 h under air atmosphere at a temperature of 150° C. The cured film was then removed from the PTFE support and a 1 mm×1 mm piece having a recess at one edge to fit on a LED chip (as shown in FIG. 7) was cut.

Example 3

A mixture of 10 g organopolysilazane Material A, 1.5 g Heptane, 17 g YAG Phosphor and 8 g OGA Phosphor was coated on a PTFE plate with a plain surface at a film thickness of 100 µm. The material was cured for 16 h under air atmosphere at a temperature of 150° C. The cured film was then removed from the PTFE support and a 1 mm×1 mm piece having a recess at one edge to fit on a LED chip (as shown in FIG. 7) was cut. The piece was then cured for additional 16 h under air atmosphere at a temperature of 325° C.

Example 4

Example 4 is identical to Example 3, except that Material B was used.

Example 5

Figure 14:
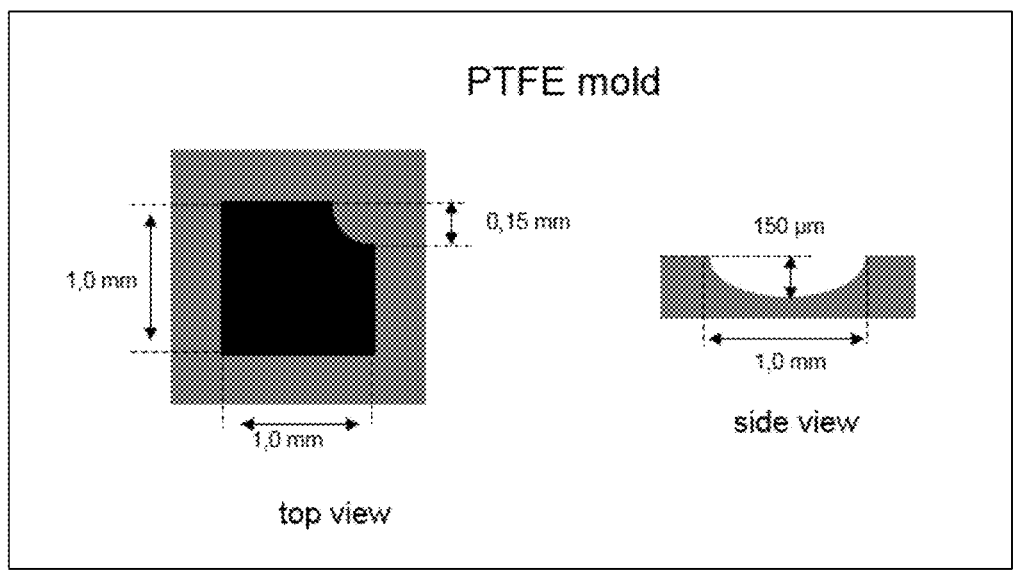
FIG. 14: PTFE mold used in Examples 5 and 6.

A mixture of 10 g organopolysiloxazane Material B, 0.05 g triphenylaluminum (AlPh$_3$), 1.5 g heptane and 25 g YAG phosphor was coated into a cavity of a PTFE mold. The cavity had an inverse lens shape as shown in FIG. 14. The material was cured for 16 h under air atmosphere at a temperature of 50° C. The cured material was then removed from the PTFE mold and the piece was cured for additional 16 h under air atmosphere at a temperature of 325° C.

Example 6

A mixture of 20 g PHPS (50% in Di-n-butyl ether) and 25 g YAG phosphor was coated into a cavity of a PTFE mold. The cavity had an inverse lens shape as shown in FIG. 14. The material was cured for 16 h under air atmosphere at a temperature of 150° C. The cured material was then removed from the PTFE mold and the piece was cured for additional 16 h under air atmosphere at a temperature of 350° C.

Example 7

Figure 15:
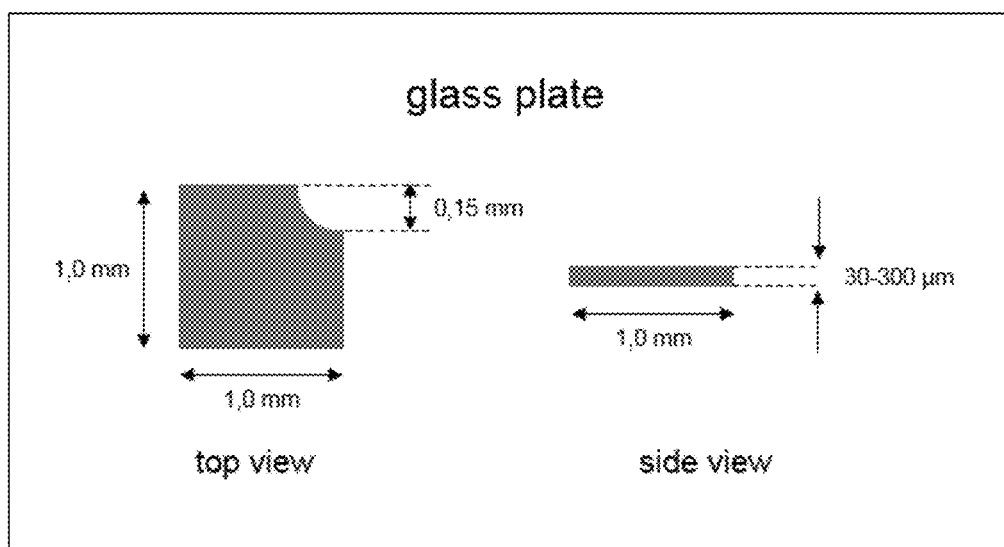
FIG. 15: Glass plate used in Examples 7 to 10.

A mixture of 20 g PHPS (50% in Di-n-butyl ether) and 25 g of YAG phosphor was coated on a plain glass plate (the glass plate was cut of glass type "Dünnglas AF 32 eco", diameter 7 mm, thickness 0.3 µm, available from Schott AG Landshut/Germany) of the shape as shown in FIG. 15 at a film thickness of 150 µm. The material was cured for 16 h under air atmosphere at a temperature of 150° C. and additional 16 h under air atmosphere at a temperature of 350° C.

Example 8

Example 8 was similar to Example 7, except that a thiogallate phosphor was used.

Example 9

A mixture of 10 g organopolysiloxazane Material B 1.5 g heptane and 25 g YAG phosphor was coated on a plain glass plate of the shape as shown in FIG. 15 at a film thickness of 150 µm. The material was cured for 16 h under air atmosphere at a temperature of 150° C. and additional 16 h under air atmosphere at a temperature of 325° C.

Example 10

A mixture of 10 g organopolysilazane Material A, 1.5 g heptane and 25 g of thiogallate phosphor was coated on a plain glass plate of the shape as shown in FIG. 15 at a film thickness of 150 µm. The material was cured for 16 h under air atmosphere at a temperature of 150° C. and additional 16 h under air atmosphere at a temperature of 325° C.

Example 11

A mixture of 10 g organopolysilazane Material A, 0.05 g triphenylaluminum (AlPh$_3$), 1.5 g heptane and 25 g thiogallate phosphor was coated on a PTFE plate with a plain surface at a film thickness of 100 µm. The material was cured for 16 h under air atmosphere at a temperature of 50° C. The cured film was then removed from the PTFE support and a 1 mm×1 mm piece having a recess at one edge to fit on a LED chip (as shown in FIG. 7) was cut. The piece was then cured for 16 h under air atmosphere at a temperature of 325° C.

LED Devices

To show its usefulness for LED devices, the wavelength converting components prepared in the examples above were tested in LED packages. The platelets were attached on top of the LED chip forming part of a LED package available from Excelitas [Aculed LED COB-Packages with an OSRAM ODB40RG chip, available from Excelitas Technologies Munich/Germany]. To attach the platelets on the LED chip, a small amount of 90% PHPS in di-n-butylether was dropped on top of the LED chip and the platelets were positioned on the PHPS-wet chip. Then the LED package was heated to 175° C. for 8 h to cure the PHPS layer. As reference materials, methyl silicone (OE-6370, DowCorning) and phenyl silicone (OE-6550 DowCorning) were used for encapsulation. The reference LEDs were prepared by spraying a mixture of silicone and YAG phosphor in a weight ratio of 1:2.5 on the LED chip and curing the coating for 4 h at 150° C. The LEDs were then operated at a current of 1.5 A at ambient conditions for 1500 h and the change in colour coordinates was measured. A generally tolerated deviation of colour coordinates after 1500 h is +/−1% which corresponds to a change in the colour coordinates of +/−0.01. The measured colour point deviation is shown in subsequent Table 4.

TABLE 4

Deviation of colour point.

| Wavelength converting component | Δx/Δy after 1500 h[1] |
|---|---|
| Phenyl silicone (reference) | +0.011/+0.033 |
| Methyl silicone (reference) | +0.005/+0.012 |
| Example 1 | ≤+/−0.001/≤+/−0.001 |
| Example 2 | ≤+/−0.006/≤+/−0.013 |
| Example 4 | ≤+/−0.001/≤+/−0.001 |
| Example 5 | ≤+/−0.001/≤+/−0.001 |
| Example 7 | ≤+/−0.001/≤+/−0.001 |

[1]Measurement error = +/−0.001.

The wavelength converting components of Examples 1, 4, 5 and 7 were cured at temperatures of 325° C. (Examples 1, 4 and 5) or 350° C. (Example 7) and showed no detectable colour change over the complete period of 1500 h. The material of Example 2 was precured at only 150° C. and showed a colour change in between methyl and phenyl silicone. This proves the excellent colour stability of the high temperature cured wavelength converting components.

To demonstrate the better barrier properties, the wavelength converting components of Example 11 were tested on LEDs operated at 350 mA in a climate chamber under 85° C. and 85% relative humidity. As reference material methyl silicone (OE-6370, DowCorning) was used for encapsulation. The reference LEDs were prepared by spraying a mixture of silicone and thiogallate phosphor in a weight ratio of 1:2.5 on the LED chip and curing the coating for 4 h at 150° C. The change in photometric intensity and colour point was measured after 500 h as shown in Table 5.

TABLE 5

Change in photometric intensity and colour point.

| Wavelength converting component | Photometric intensity change after 500 h[1] | Colour change after 500 h |
|---|---|---|
| Methyl silicone (reference) | 52 | Δx = −0.253/Δy = −0.476 |
| Example 11 | 91 | Δx = −0.018 /Δy = −0.029 |

[1]The initial intensity was normalized to 100%.

Figure 12A:
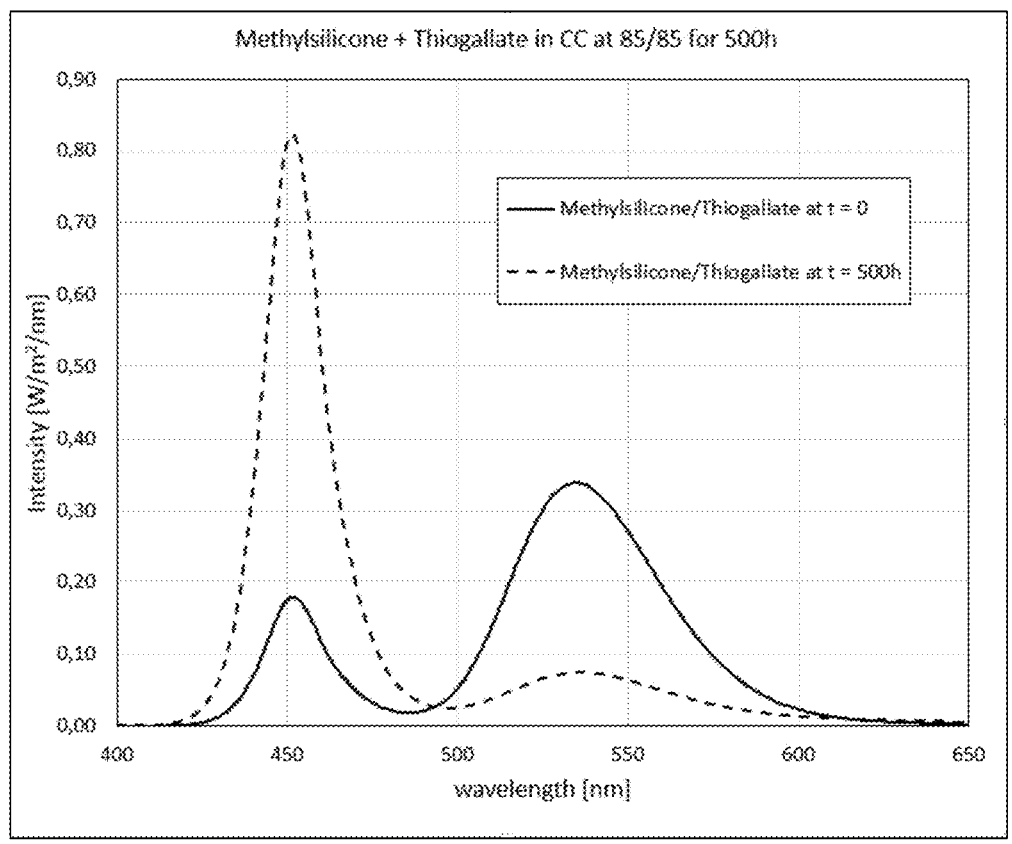
FIG. 12*a*: Emission spectrum of thiogallate in methyl silicone before and after storing for 500 h in a climate chamber at 85° C. and 85% relative humidity.
—————— =initial spectrum before storing;
- - - - - - - =spectrum after storing for 500 h in climate chamber at 85° C. and 85% relative humidity.
Figure 12B:
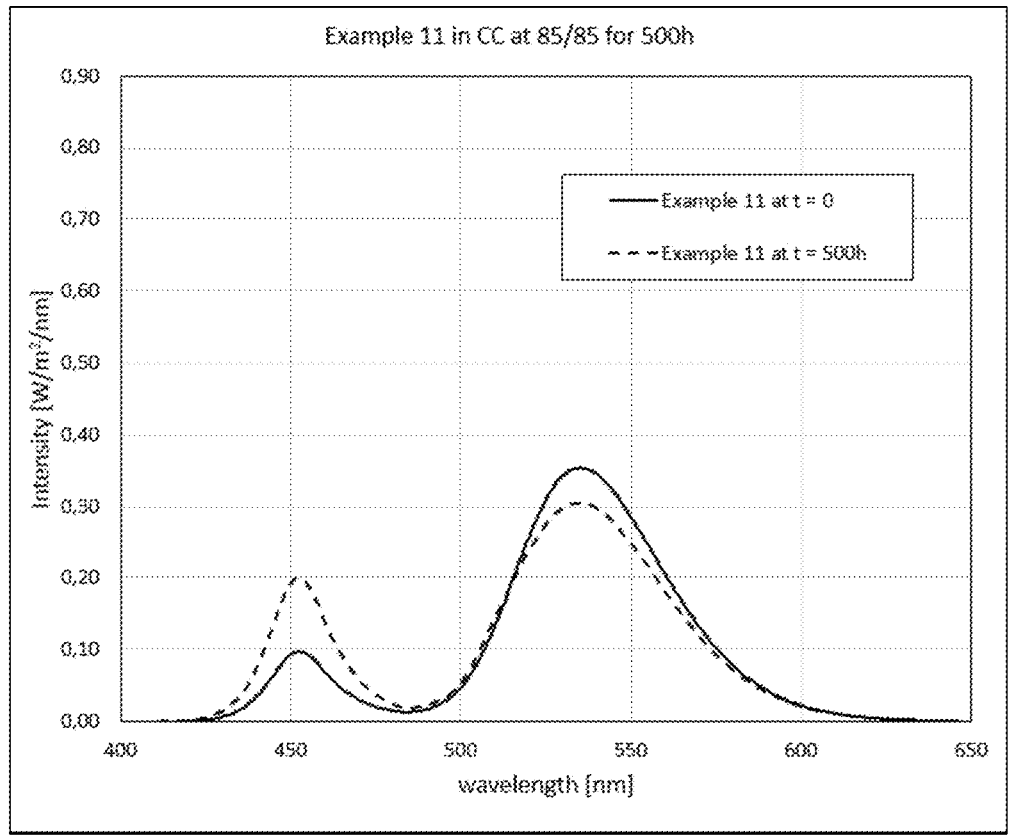
FIG. 12*b*: Emission spectrum of thiogallate in organopolysilazane cured at 325° C. for 16 h before and after storing for 500 h in a climate chamber at 85° C. and 85% relative humidity.
—————— =initial spectrum before storing;
- - - - - - - =spectrum after storing for 500 h in climate chamber at 85° C. and 85% relative humidity.

The degradation of the phosphor causing the drop in photometric intensity and the change of the colour point can be observed in the emission spectra before and after the climate chamber treatment shown in FIGS. 12a and 12b.

The wavelength converting component of Example 11 which was precured at 50° C. and cured at 325° C. showed a drop of intensity by 9% while the reference material methyl silicone showed a drop by 48%. This drop is caused by the degradation of the thiogallate phosphor under climate chamber conditions of 85° C. and 85% relative humidity. This result proves the improved barrier properties of the high temperature cured silazane materials. Better barrier properties allow the use of unstable phosphors, which would degrade in an inacceptable short time when used in combination with a conventional silicone encapsulant.

Figure 13:
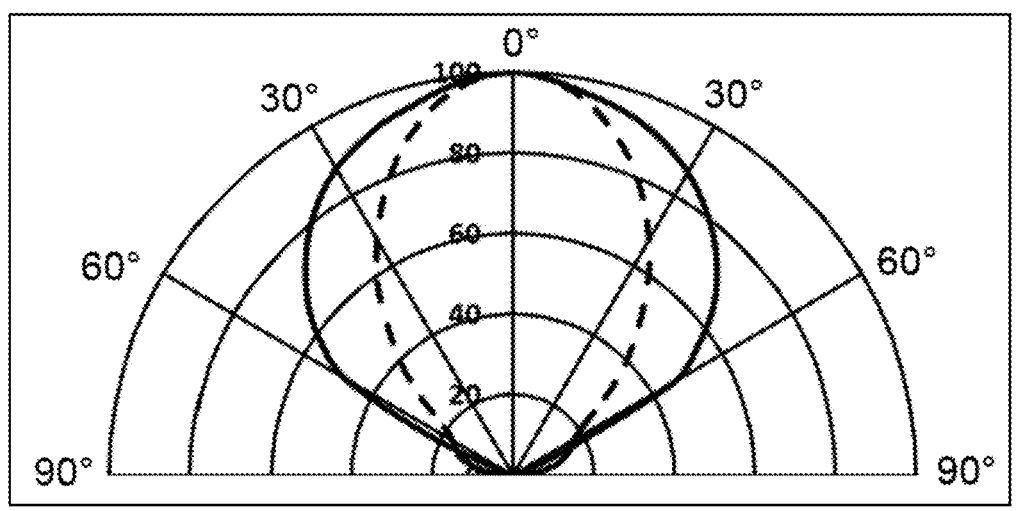
FIG. 13: Angular dependence of emitted light.
—————— =LED chip coated with a lens-shaped platelet. Intensity normalized to 100% at angle of 00;
- - - - - - - =LED chip coated with a plain platelet. Intensity normalized to 100% at angle of 0°.

To demonstrate the effect of the shaped platelet, the angular radiation intensity of the wavelength converting components of Example 1 (plain platelet) and Example 5 (lens-shaped platelet) attached on a LED chip was measured (see FIG. 13). The different angular intensity distribution of the plain and the lens shaped platelets demonstrates the versatility and usefulness of the production method to form wavelength converting components with specific shapes thereby controlling the angle-dependent intensity. Pouring the liquid precursor material into molds of various shapes is an easy way to produce three-dimensional wavelength converting components with variable and predictable areal light distributions.

The invention claimed is:

1. A method of manufacturing a wavelength converting component, wherein the wavelength converting component contains at least one wavelength converting material and a matrix material, and
wherein the method comprises the following steps:
(a) providing a dispersion containing a crosslinkable ceramizable material and at least one wavelength converting material, wherein the crosslinkable ceramizable material is a polymer containing a silazane repeating unit $M^1$;
(b-1) precuring said dispersion at a first temperature of $\geq 150$ to $\leq 250°$ C.; and
(b-2) curing said precured dispersion at a second temperature of $>300$ to $\leq 500°$ C. to obtain a wavelength converting component;
wherein the precuring in step (b-1) is carried out in a mold or on a plate and the precured dispersion is removed from the mold or plate before the curing in step (b-2) takes place; and
wherein the curing in step (b-2) is carried out for $\geq 1$ min to $\leq 24$ h.

2. The method according to claim 1, wherein the silazane repeating unit $M^1$ is represented by formula (I):

$$-[-SiR^1R^2-NR^3-]-  \quad (I)$$

wherein $R^1$, $R^2$ and $R^3$ are independently from each other hydrogen or alkyl.

3. The method according to claim 2, wherein $R^1$, $R^2$ and $R^3$ in formula (I) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms.

4. The method according to claim 2, wherein the polymer contains a further silazane repeating unit $M^2$, wherein $M^2$ is represented by formula (II):

$$-[-SiR^4R^5-NR^6-]-  \quad (II)$$

wherein $R^4$, $R^5$ and $R^6$ are independently from each other hydrogen or alkyl; and
wherein $M^2$ is different from $M^1$.

5. The method according to claim 4, wherein $R^4$, $R^5$ and $R^6$ in formula (II) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms.

6. The method according to claim 2, wherein the polymer contains a further repeating unit $M^3$, wherein $M^3$ is represented by formula (III):

$$-[-SiR^7R^8-[O-SiR^7R^8-]_a-NR^9-]-  \quad (III)$$

wherein
$R^7$, $R^8$, $R^9$ are independently from each other hydrogen or alkyl; and
a is an integer from 1 to 60.

7. The method according to claim 6, wherein $R^7$, $R^8$ and $R^9$ in formula (III) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms.

8. The method according to claim 1, wherein the at least one wavelength converting material is selected from phosphors or converters based on semiconductor nanoparticles.

9. A wavelength converting component obtained by the method according to claim 1, wherein the matrix material contains Si—N bonds and wherein the matrix material has a density of $\geq 1.21$ g/cm$^3$ at 25° C., and wherein the matrix material shows a weight loss of $\leq 0.5$ weight-%, upon heating from 25 to 350° C. under air atmosphere.

10. A wavelength converting component obtained by the method according to claim 1, wherein the matrix material contains Si—N bonds and wherein the matrix material has a density of $\geq 1.16$ g/cm$^3$ at 25° C., and wherein the matrix material shows a weight loss of $\leq 0.5$ weight-%, upon heating from 25 to 350° C. under air atmosphere.

11. A wavelength converting component obtained by the method according to claim 1, wherein the matrix material contains Si—N bonds and wherein the matrix material has a coefficient of thermal expansion of $\leq 150$ ppm/K in a temperature range from 25 to 80° C., and wherein the matrix material shows a weight loss of $\leq 0.5$ weight-%, upon heating from 25 to 350° C. under air atmosphere.

12. A light source comprising a primary light source and a wavelength converting component according to claim 10.

13. A lighting unit which comprises at least one light source according to claim 12.

14. A method for the conversion of blue, violet and/or UV light from a primary light source into light with a longer wavelength comprising passing the light through a wavelength converting component of claim 9.

15. A method for the conversion of blue, violet and/or UV light from a primary light source into light with a longer wavelength, comprising passing the light through a wavelength converting component of claim 10.

16. A method for the conversion of blue, violet and/or UV light from a primary light source into light with a longer wavelength, comprising passing the light through a wavelength converting component of claim 11.

17. The lighting unit according to claim 13, which is a lighting unit for a projector or an automobile.

18. The method according to claim 1, wherein the mold is a PTFE mold or a PVDF mold and the plate is a PTFE plate or a PVDF plate.

19. The method according to claim 1, wherein said first temperature is $\geq 150$ to $\leq 250°$ C., and said second temperature of $>305$ to $\leq 500°$ C.

20. The method according to claim 1, wherein the precuring in step (b-1) is carried out for a time period of $\geq 1$ min to $\leq 10$ h.

21. The method according to claim 1, wherein the precuring in step (b-1) is carried out for a time period of $\geq 1$ hr to $\leq 10$ h and the curing in step (b-2) is carried out for $\geq 1$ hr to $\leq 24$ h.

22. A light source comprising a primary light source and a wavelength converting component according to claim 11.

23. A lighting unit which comprises at least one light source according to claim 22.

24. The lighting unit according to claim 23, which is a lighting unit for a projector or an automobile.

25. A light source comprising a primary light source and a wavelength converting component according to claim 9.

26. A lighting unit which comprises at least one light source according to claim 25.

27. The lighting unit according to claim 26, which is a lighting unit for a projector or an automobile.

* * * * *